United States Patent
Lee et al.

(10) Patent No.: US 11,622,481 B2
(45) Date of Patent: Apr. 4, 2023

(54) ELECTRONIC DEVICE INCLUDING SHIELD MEMBER FOR SHIELDING AT LEAST PART OF MAGNETIC FORCE GENERATED BY MAGNETIC SUBSTANCE AND CONNECTION PORTION INCLUDING PROPERTY OF NONMAGNETIC SUBSTANCE CONNECTED TO SHIELD MEMBER

(71) Applicant: Samsung Electronics Co., Ltd., Suwon-si (KR)

(72) Inventors: Gihoon Lee, Suwon-si (KR); Seunggoo Kang, Suwon-si (KR); Yonghwa Kim, Suwon-si (KR); Hongjun Kim, Suwon-si (KR); Wangik Son, Suwon-si (KR); Jaehwan Lee, Suwon-si (KR); Seungbum Choi, Suwon-si (KR); Jaedeok Lim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/144,643

(22) Filed: Jan. 8, 2021

(65) Prior Publication Data
US 2021/0136965 A1   May 6, 2021

Related U.S. Application Data

(63) Continuation of application No. 16/281,752, filed on Feb. 21, 2019, now Pat. No. 10,893,637.

(30) Foreign Application Priority Data

Feb. 21, 2018 (KR) .................. 10-2018-0020517
Sep. 7, 2018 (KR) .................. 10-2018-0106851

(51) Int. Cl.
H05K 9/00    (2006.01)
H05K 1/02    (2006.01)
H05K 5/02    (2006.01)

(52) U.S. Cl.
CPC ......... H05K 9/0075 (2013.01); H05K 1/0216 (2013.01); H05K 5/0247 (2013.01); H05K 9/002 (2013.01); H05K 9/0022 (2013.01)

(58) Field of Classification Search
CPC .... H05K 1/0216; H05K 5/0247; H05K 9/002; H05K 9/0022; H05K 9/0075
See application file for complete search history.

(56) References Cited

U.S. PATENT DOCUMENTS 6,744,640 B2   6/2004   Reis et al.
8,018,734 B2   9/2011   Brewer et al.
(Continued)

FOREIGN PATENT DOCUMENTS

CN   101682986 A   3/2010
CN   103164874 A   6/2013
(Continued)

OTHER PUBLICATIONS

International Search Report and Written Opinion dated Jun. 7, 2019, issued International Application No. PCT/KR2019/002161.
(Continued)

Primary Examiner — Nathan Milakovich
(74) Attorney, Agent, or Firm — Jefferson IP Law, LLP

(57) ABSTRACT

An electronic device including a shield structure is provided. The electronic device includes a first device including a first magnetic substance, a second device including a second magnetic substance, and a shield structure configured to shield at least part of a magnetic force generated between the first magnetic substance and the second magnetic substance, wherein the shield structure includes a shield member dis-
(Continued)

posed between the first device and the second device and including a property of a magnetic substance, and a connecting member physically connected to at least part of the shield member and including a property of a nonmagnetic substance, wherein at least part of the connecting member is physically connected to a circuit board.

21 Claims, 17 Drawing Sheets

(56) References Cited

U.S. PATENT DOCUMENTS

| | | |
|---|---|---|
| 9,179,538 B2 | 11/2015 | Foster et al. |
| 9,363,884 B2 | 6/2016 | Yang et al. |
| 2006/0180880 A1 | 8/2006 | Wang et al. |
| 2008/0310135 A1 | 12/2008 | Schack et al. |
| 2009/0052142 A1 | 2/2009 | Brewer et al. |
| 2009/0227136 A1 | 9/2009 | Tokii |
| 2012/0020039 A1 | 1/2012 | Coffy et al. |
| 2012/0286049 A1 | 11/2012 | McCormack et al. |
| 2012/0320558 A1 | 12/2012 | Foster et al. |
| 2014/0055957 A1 | 2/2014 | Yang et al. |
| 2015/0022142 A1 | 1/2015 | Garcia Briz et al. |
| 2015/0237713 A1 | 8/2015 | Elsherbini et al. |
| 2016/0021742 A1 | 1/2016 | Johansson et al. |
| 2016/0057897 A1 | 2/2016 | Malek et al. |
| 2016/0091575 A1 | 3/2016 | Yamada et al. |
| 2016/0174407 A1 | 6/2016 | Inaba et al. |
| 2017/0172020 A1 | 6/2017 | Ye et al. |
| 2017/0251549 A1 | 8/2017 | Lee et al. |
| 2018/0070482 A1 | 3/2018 | Choi et al. |
| 2019/0014696 A1 | 1/2019 | Choi et al. |
| 2019/0082563 A1 | 3/2019 | Wah et al. |
| 2019/0320253 A1 | 10/2019 | Park et al. |
| 2020/0053919 A1 | 2/2020 | Lee et al. |
| 2020/0236826 A1 | 7/2020 | Baek et al. |

FOREIGN PATENT DOCUMENTS

| | | |
|---|---|---|
| CN | 104205657 A | 12/2014 |
| CN | 104392537 A | 3/2015 |
| CN | 105376938 A | 3/2016 |
| CN | 105379064 A | 3/2016 |
| CN | 106912190 A | 6/2017 |
| CN | 107211555 A | 9/2017 |
| JP | H03-25999 A | 2/1991 |
| JP | 2000-277970 A | 10/2000 |
| JP | 2011091238 A | 5/2011 |
| JP | 2014514771 A | 6/2014 |
| KR | 10-0349379 B1 | 8/2002 |
| KR | 10-2005-0064549 A | 6/2005 |
| KR | 10-1007120 B1 | 1/2011 |
| KR | 10-2014-0023381 A | 2/2014 |
| KR | 10-2014-0055755 A | 5/2014 |
| KR | 10-2016-0143622 A | 12/2016 |

OTHER PUBLICATIONS

European Search Report dated Jul. 3, 2019, issued in European Application No. 19158533.0-1203.
Chinese Office Action dated Jun. 2, 2022, issued in Chinese Patent Application No. 201980014387.7.
Extended European Search Report dated Dec. 13, 2022, issued in European Patent Application No. 22192987.0.
Chinese Notice of Allowance dated Jan. 11, 2023, issued in Chinese Patent Application No. 201980014387.7.

ELECTRONIC DEVICE INCLUDING SHIELD MEMBER FOR SHIELDING AT LEAST PART OF MAGNETIC FORCE GENERATED BY MAGNETIC SUBSTANCE AND CONNECTION PORTION INCLUDING PROPERTY OF NONMAGNETIC SUBSTANCE CONNECTED TO SHIELD MEMBER

CROSS-REFERENCE TO RELATED APPLICATION(S)

This application is a continuation application of prior application Ser. No. 16/281,752, filed on Feb. 21, 2019, which has issued as U.S. Pat. No. 10,893,637 on Jan. 12, 2021 and is based on and claims priority under 35 U.S.C. § 119(a) of a Korean patent application number 10-2018-0020517, filed on Feb. 21, 2018, and claims priority under 35 U.S.C. § 119(a) of a Korean patent application number 10-2018-0106851, filed on Sep. 7, 2018, in the Korean Intellectual Property Office, the disclosure of which is incorporated by reference herein in its entirety.

BACKGROUND

1. Field

The disclosure relates to an electronic device including a structure for shielding a magnetic force between electronic components.

2. Description of the Related Art

Nowadays, with the development of digital technology, there is wide use of various types of electronic devices such as a mobile communication terminal, a smart phone, a tablet personal computer (PC), a notebook computer, a personal digital assistant (PDA), a wearable device, or a digital camera.

An electronic device (e.g., a smartphone) may include various electronic components (e.g., receiver, speaker, camera, magnetic sensor, and acceleration sensor) including a magnetic substance for an operation thereof. For example, the receiver may include a coil and a magnet as an actuator of a diaphragm. As another example, the camera may include a coil and a magnet as an actuator for moving a lens. As electronic components including a magnetic substance are mounted in a limited space of the electronic device, the electronic components may affect adjacent other electronic components by a magnetic force. For example, electronic components each including a magnetic substance may be disposed adjacent to each other in an inner space of the electronic device: and, in this case, the magnetic substances may mutually affect each other; thus, an error may arise in an operation of the electronic component. According to an embodiment, an error may occur in an operation of other adjacent electronic components by an influence of a magnetic force radiated from the magnetic substance of the electronic component.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provides an electronic device that enables electronic components to operate without errors from a magnetic force, even if the electronic components each including a magnetic substance are installed adjacent to each other.

Another aspect of the disclosure is to provide an electronic device capable of effectively shielding a magnetic force between two adjacent magnetic substances therein.

Another aspect of the disclosure is to provide an electronic device that enables design of a minimum shield structure (magnetic shield member) based on at least a driving method of an electronic component in designing a shield structure for shielding a magnetic force between two adjacent magnetic substances therein.

Another aspect of the disclosure is to provide an electronic device including a shield structure that can increase the magnetic shield effect while minimizing a separation distance between electronic components including magnetic substances.

Another aspect of the disclosure is to provide an electronic device including a shield structure capable of shielding a magnetic force between adjacent magnetic substances by disposing a nonmagnetic material and a magnetic shield material, which is a magnetic material on a circuit board constructed between electronic components mounted therein.

Additional aspects will be set forth in part in the description which follows and, in part, will be apparent from the description, or may be learned by practice of the presented embodiments.

In accordance with an aspect of the disclosure, an electronic device is provided. The electronic device includes a first device including a first magnetic substance, a second device including a second magnetic substance, and a shield structure configured to shield at least part of a magnetic force generated between the first magnetic substance and the second magnetic substance, wherein the shield structure includes a shield member disposed between the first device and the second device and including a property of a magnetic substance, and a connecting member physically connected to at least part of the shield member and including a property of a nonmagnetic substance, wherein at least part of the connecting member is physically connected to a circuit board.

In accordance with another aspect of the disclosure, an electronic device is provided. The electronic device includes a circuit board, a first device including a first magnetic substance, a second device including a second magnetic substance, and a shield structure configured to shield at least part of a magnetic force generated between the first magnetic substance and the second magnetic substance, wherein the shield structure includes a shield member disposed between the first device and the second device and including a property of a magnetic substance capable of shielding the at least part of the magnetic force, and a connecting member physically connected to at least part of the shield member and fixed to the circuit board, wherein the connecting member has a property of a nonmagnetic substance magnetically separated from the at least part of the magnetic force.

In accordance with another aspect of the disclosure, an electronic device is provided. The electronic device includes a device including a magnetic substance, a circuit board, and a shield structure configured to shield at least part of a magnetic field generated by the magnetic substance, wherein the shield structure includes a shield member disposed between the device and another device included in the electronic device and including a property of a ferromagnetic substance capable of shielding the at least partial magnetic field, and a connecting member physically connected between the circuit board and at least part of the shield member, wherein the connecting member has a property of a nonmagnetic substance magnetically separated from the at least partial magnetic field.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, like reference numerals will be understood to refer to like parts, components, and structures.

DETAILED DESCRIPTION

The following description reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
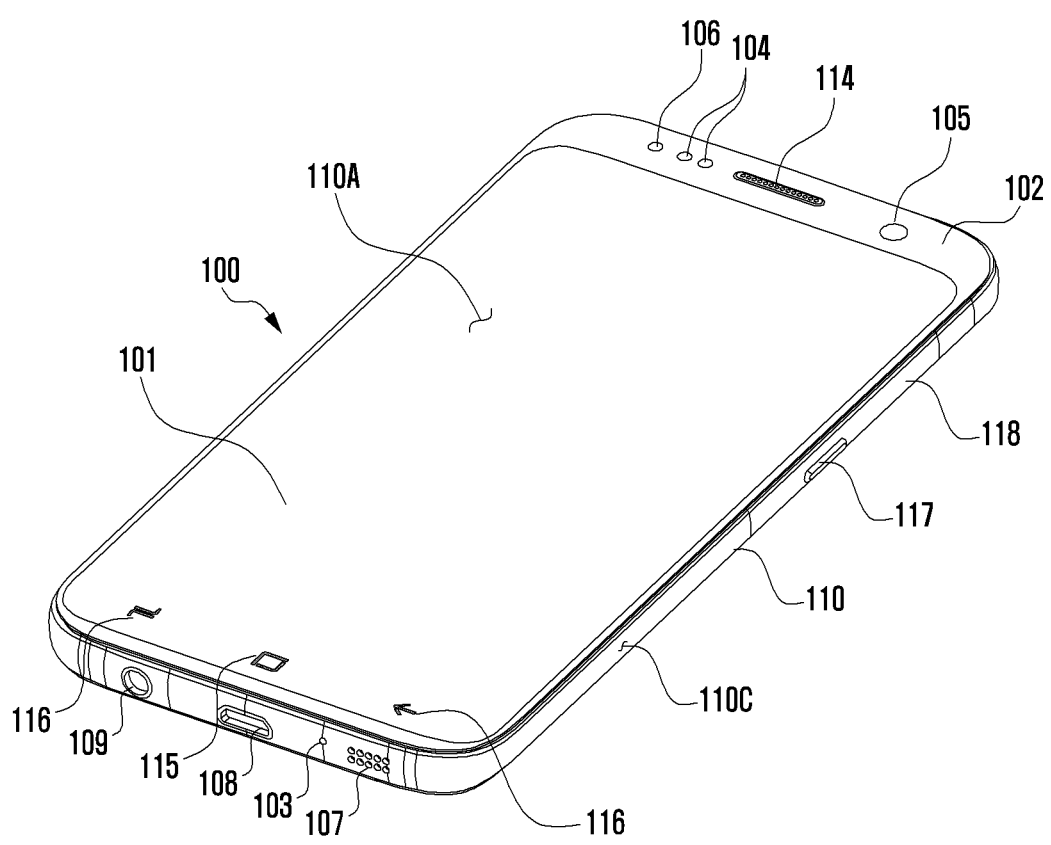
FIG. 1 is a front perspective view illustrating an electronic device according to various embodiments of the disclosure.
Figure 2:
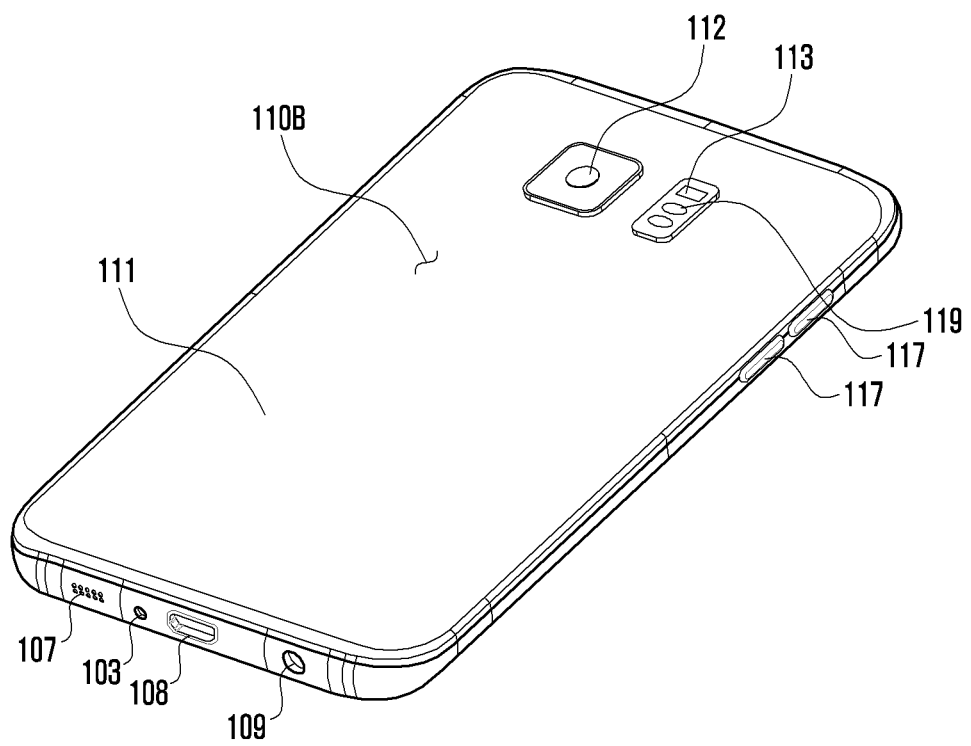
FIG. 2 is a rear perspective view illustrating the electronic device of FIG. 1 according to an embodiment of the disclosure.

FIG. 1 is a front perspective view illustrating an electronic device according to various embodiments of the disclosure. FIG. 2 is a rear perspective view illustrating the electronic device of FIG. 1 according to an embodiment of the disclosure.

Referring to FIGS. 1 and 2, an electronic device 100 according to various embodiments may include a housing 110 including a first plate (or front surface) 110A, a second plate (or rear surface) 110B, and a side surface 110C enclosing a space between the first plate 110A and the second plate 110B. According to an embodiment (not illustrated), the housing 110 may refer to a structure forming part of the first plate 110A, the second plate 110B, and the side surface 110C of FIG. 1. According to an embodiment, the first plate 110A may include a front plate 102 (e.g., a polymer plate or a glass plate including various coating layers) in which at least part is substantially transparent. The second plate 110B may be formed by a substantially opaque rear plate 111. The rear plate 111 may be formed with, for example, coating or tinted glass, ceramic, a polymer, a metal (e.g., aluminum, stainless steel (STS), or magnesium) or a combination of at least two of these materials. The side surface 110C may be formed by a side bezel structure (or "side member") 118 coupled to the front plate 102 and the rear plate 111 and including a metal and/or a polymer. In some embodiments, the rear plate 111 and the side bezel structure 118 may be integrally formed and include the same material (e.g., a metal material such as aluminum).

According to an embodiment, the electronic device 100 may include at least one of a display 101, a microphone hole 103, speaker holes 107, a speaker hole 114, a first sensor module 104, a second sensor module 119, a first camera device 105, a second camera device 112, a flash 113, a home key button 115, a touch button 116, a side key button 117, an indicator 106, a first connector hole 108, or a second connector hole 109. In some embodiments, the electronic device 100 may omit at least one of the components or may additionally include other components.

The display 101 may be exposed through, for example, a substantial portion of the front plate 102. The display 101 may be coupled to a touch sensing circuit, a pressure sensor capable of measuring the intensity (pressure) of a touch, and/or a digitizer for detecting a stylus pen of a magnetic field method or may be disposed adjacent thereto.

A microphone hole 103, speaker holes 107, and a speaker hole 114 may be included. A microphone may be disposed at the microphone hole 103 for obtaining an external sound therein, and in some embodiments, a plurality of microphones may be disposed to detect a direction of a sound. One or more speakers may be disposed at the speaker holes 107 for outputting sound outside the electronic device 100. A speaker may be disposed at the speaker hole 114 for outputting sound outside the electronic device 100 to an ear disposed adjacent to the electronic device 100. In some embodiments, the speaker holes 107, and speaker hole 114, and the microphone hole 103 may be implemented as a single hole or a speaker (e.g., piezo speaker) may be formed without speaker holes 107 and the speaker hole 114.

The first sensor module 104 and second sensor module 119 may generate an electrical signal or a data value corresponding to an operating state within the electronic device 100 or an external environment state. The first sensor module 104 may be a proximity sensor and/or a fingerprint sensor disposed at the first plate 110A of the housing 110. The second sensor module 119 may be a heart rate monitoring (HRM) sensor disposed at the second plate 110B of the housing 110. The fingerprint sensor may be disposed at the second plate 110B as well as the first plate 110A (e.g., a home key button 115) of the housing 110. The electronic device 100 may include a sensor module (not illustrated), for example, at least one of a gesture sensor, gyro sensor, barometer sensor, magnetic sensor, acceleration sensor, grip sensor, proximity sensor, color sensor (e.g., red, green, and blue (RGB) sensor), infrared (IR) sensor, bio sensor (medical sensor, biometric sensor), temperature sensor, humidity sensor, or illuminance sensor.

A first camera device 105 disposed at the first plate 110A of the electronic device 100, a second camera device 112 disposed at the second plate 110B, and/or a flash 113 may be included. The first camera device 105 and the second camera device 112 may include one or more lenses, an image sensor, and/or an image signal processor (ISP). The flash 113 may include, for example, a light emitting diode (LED) or a xenon lamp. In some embodiments, two or more lenses (wide angle and telephoto lenses) and image sensors may be disposed at one surface of the electronic device 100.

A home key button 115 disposed at the first plate 110A of the housing 110, a touch button 116 disposed at a periphery of the home key button 115, and/or a side key button 117 disposed at the side surface 110C of the housing 110 may be included. In another embodiment, the electronic device 100 may not include some or all of the above-mentioned home key button 115, touch button 116, and side key button 117, and the home key button 115, touch button 116, and side key button 117 that are not included may be implemented as different forms such as a soft key on the display 101.

The indicator 106 may be disposed at, for example, the first plate 110A of the housing 110. The indicator 106 may provide, for example, status information of the electronic device 100 in an optical form and include a LED.

The first connector hole 108 may receive a connector (e.g., a universal serial bus (USB) connector) for transmitting and receiving power and/or data to and from an external electronic device and/or the second connector hole 109 may be an earphone jack that may receive a connector for transmitting and receiving an audio signal to and from an external electronic device.

Figure 3:
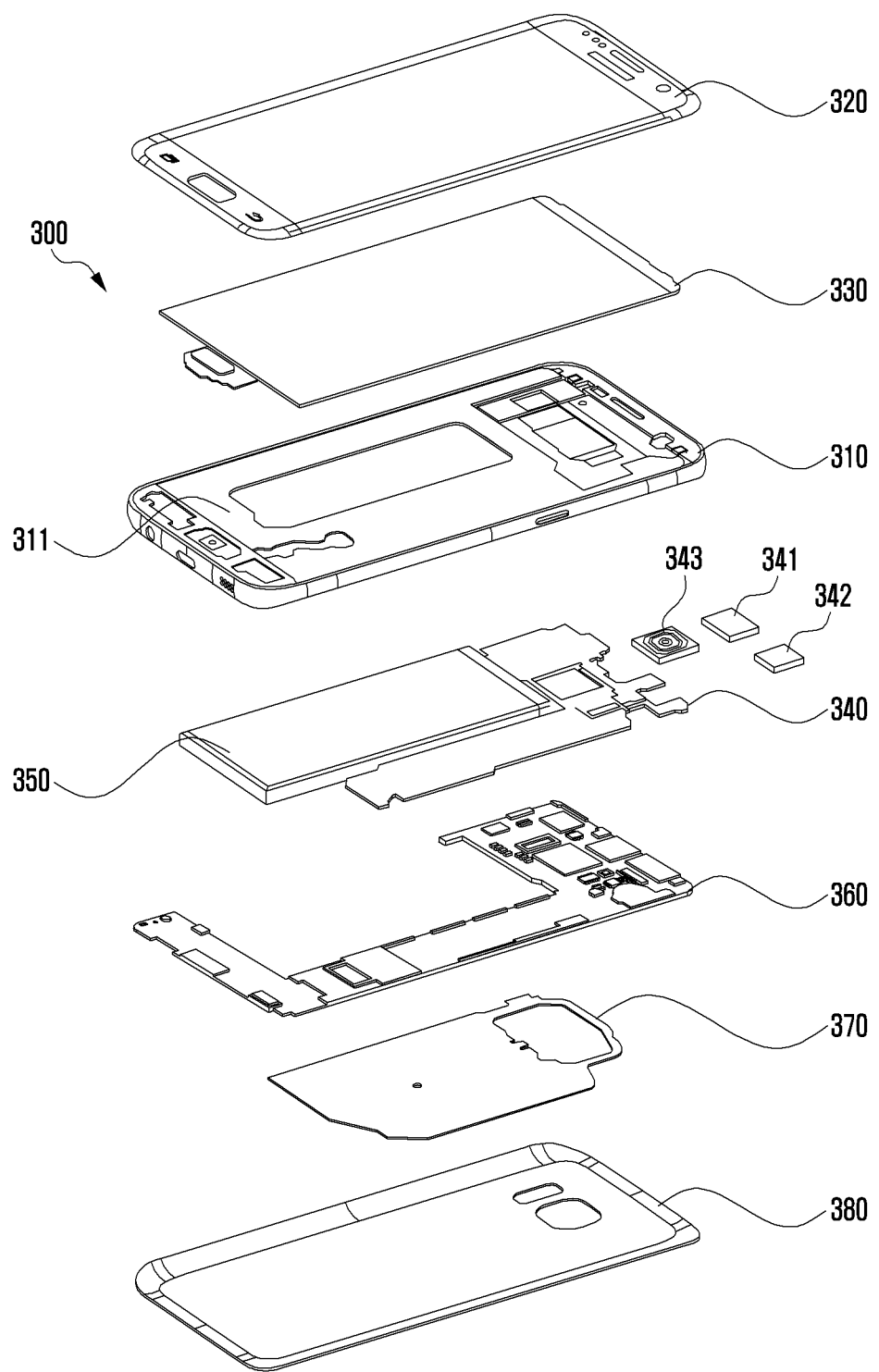
FIG. 3 is an exploded perspective view illustrating the electronic device of FIG. 1 according to an embodiment of the disclosure.

FIG. 3 is an exploded perspective view illustrating the electronic device of FIG. 1 according to an embodiment of the disclosure.

Referring to FIG. 3, an electronic device 300 may include a side bezel structure 310, a first support member 311 (e.g., a bracket), a front plate 320, a display 330, a printed circuit board (PCB) 340, a receiver 341 (or speaker), at least one front-facing camera 342 (or selfie camera), at least one back-facing camera 343, a battery 350, a second support member 360 (e.g., a rear case), an antenna 370, and a rear plate 380.

In some embodiments, the first support member 311, the PCB 340, and the second support member 360 may form a groove (e.g., fixing groove) for fixing and mounting the receiver 341, the at least one front-facing camera 342, and the at least one back-facing camera 343; and the receiver 341, the at least one front-facing camera 342, and the at least one back-facing camera 343 may be fixed to and mounted in the electronic device 300 based on at least the fixing groove of the PCB 340. In some embodiments, the electronic device 300 may omit at least one (e.g., the first support member 311, the second support member 360) of the components or may further include other components. At least one of the components of the electronic device 300 may be the same as or similar to at least one of the components of the electronic device 100 of FIG. 1 or 2, and redundant descriptions are omitted hereinafter.

The first support member 311 may be disposed inside the electronic device 300 to be connected to the side bezel structure 310 or may be integrally formed with the side bezel structure 310. The first support member 311 may be made of, for example, a metal material and/or a non-metal (e.g., polymer) material. The display 330 may be coupled to one side of the first support member 311, and the PCB 340 may be coupled to the other side of the first support member 311.

In the PCB 340, a processor, memory, and/or interface may be mounted. The processor may include, for example, at least one of a central processing unit (CPU), application processor (AP), graphic processing unit (GPU), ISP, sensor hub processor, or communication processor (CP).

The memory may include, for example, a volatile memory or a non-volatile memory.

The interface may include, for example, a high definition multimedia interface (HDMI), a USB interface, a secure digital (SD) card interface, and/or an audio interface. The interface may, for example, at least one of electrically or physically connect the electronic device 300 to an external electronic device and include a USB connector, an SD card/multi-media card (MMC) connector, or an audio connector.

The battery 350 is a device for supplying power to at least one component of the electronic device 300 and may include, for example, a non-rechargeable primary cell (battery), a rechargeable secondary cell (battery), or a fuel cell (battery). At least part of the battery 350 may be disposed, for example, substantially flush with the PCB 340. The battery 350 may be integrally disposed within the electronic device 300 and may be disposed detachably from the electronic device 300.

The antenna 370 may be disposed between the rear plate 380 and the battery 350. The antenna 370 may include, for example, a near field communication (NFC) antenna, a wireless charging antenna, and/or a magnetic secure transmission (MST) antenna. The antenna 370 may perform, for example, short-range communication with an external device or may transmit and receive wirelessly power necessary for charging. In other embodiments, an antenna element may be formed by part of the first support member 311 and/or the side bezel structure 310 or a combination thereof.

Figure 4:
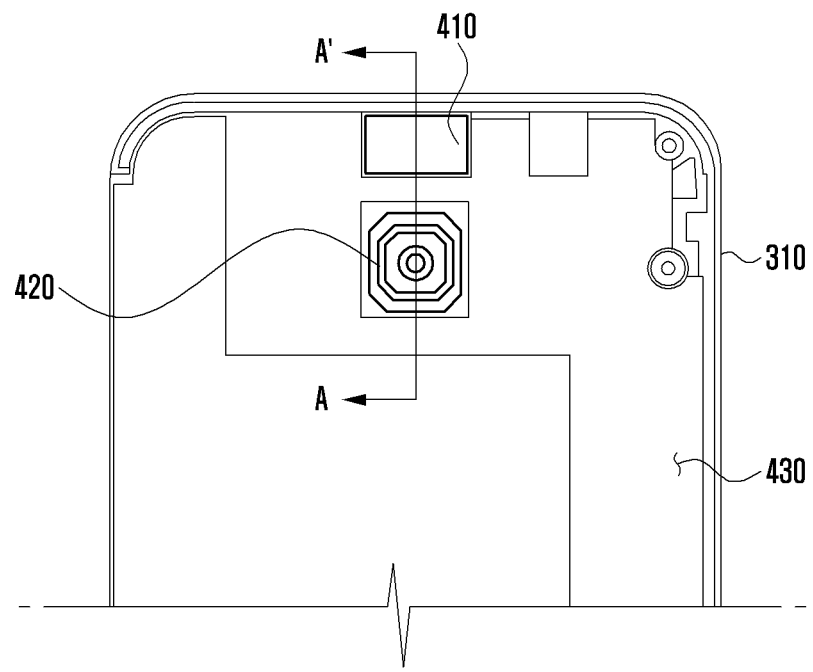
FIG. 4 is a plan view illustrating coupling of some components of the electronic device of FIG. 3 according to an embodiment of the disclosure.

FIG. 4 is a plan view illustrating coupling of some components of the electronic device of FIG. 3 according to an embodiment of the disclosure.

Referring to FIG. 4 illustrates an example of coupling two devices (or electronic components) that may be mounted in the electronic device 300 to a circuit board 430. For example, FIG. 4 illustrates an example of a structure in which a first device 410 (or a first electronic component) and a second device 420 (or a second electronic component) are fixed (or coupled) to a specified position (e.g., a groove for fixing each of the first device 410 and the second device 420) of the circuit board 430 in the electronic device 300.

In various embodiments, at one side of the circuit board 430, at least one electronic component may be provided. For example, the circuit board 430 may mechanically (or physically) fix the first device 410, the second device 420, and various electronic components (e.g., processor, memory, and/or interface) and may be the PCB 340 of FIG. 3 configured to connect by a circuit (or electrically) based on a circuit design between the respective electronic components.

In various embodiments, each of the first device 410 and the second device 420 may be mounted within a housing (e.g., the side bezel structure 310) of the electronic device 300 and be an electronic component including a magnetic substance. According to an embodiment, the first device 410 may be an electronic component (e.g., the receiver 341 of FIG. 3) including the first magnetic substance in the electronic device 300. According to an embodiment, the second device 420 may be an electronic component (e.g., the back-facing camera 343 of FIG. 3) including a second magnetic substance in the electronic device 300. In various embodiments, the devices 410 and 420 may include the foregoing electronic components and various other electronic components (e.g., magnetic sensor, acceleration sensor, and speaker) including a magnetic substance.

According to an embodiment, when the devices 410 and 420 are mounted adjacent to each other in the electronic device 300, magnetic substances of the devices 410 and 420 may affect each other; thus, an error may occur in an operation of the devices 410 and 420. To prevent such an error, electronic devices are designed to shield a magnetic force with a device or a shield structure disposed adjacent to the device and made of a conductive material (e.g., SUS, ferrite).

According to various embodiments, the electronic device 300 may include a shield structure for shielding a magnetic force by a first magnetic substance or a second magnetic substance between the first device 410 including a first magnetic substance and the second device 420 including a second magnetic substance. Hereinafter, a shield method by a shield structure for shielding a magnetic force and a structure thereof will be described in detail.

Hereinafter, in various embodiments, for convenience of description, it is described that the first device (or the first electronic component) and the second device (or the second electronic component) include respective magnetic substances, but the disclosure is not limited thereto. For example, in various embodiments, in a structure in which either the first device or the second device includes a magnetic substance and in which the other device does not include a magnetic substance, the disclosure may be applied to a structure that shields at least part of a magnetic force generated by the device including the magnetic substance. According to an embodiment, in a structure in which the first device includes a magnetic substance and in which the second device does not include a magnetic substance, the disclosure may include a structure that shields at least part of a magnetic force generated by the magnetic substance of the first device.

Figure 5:
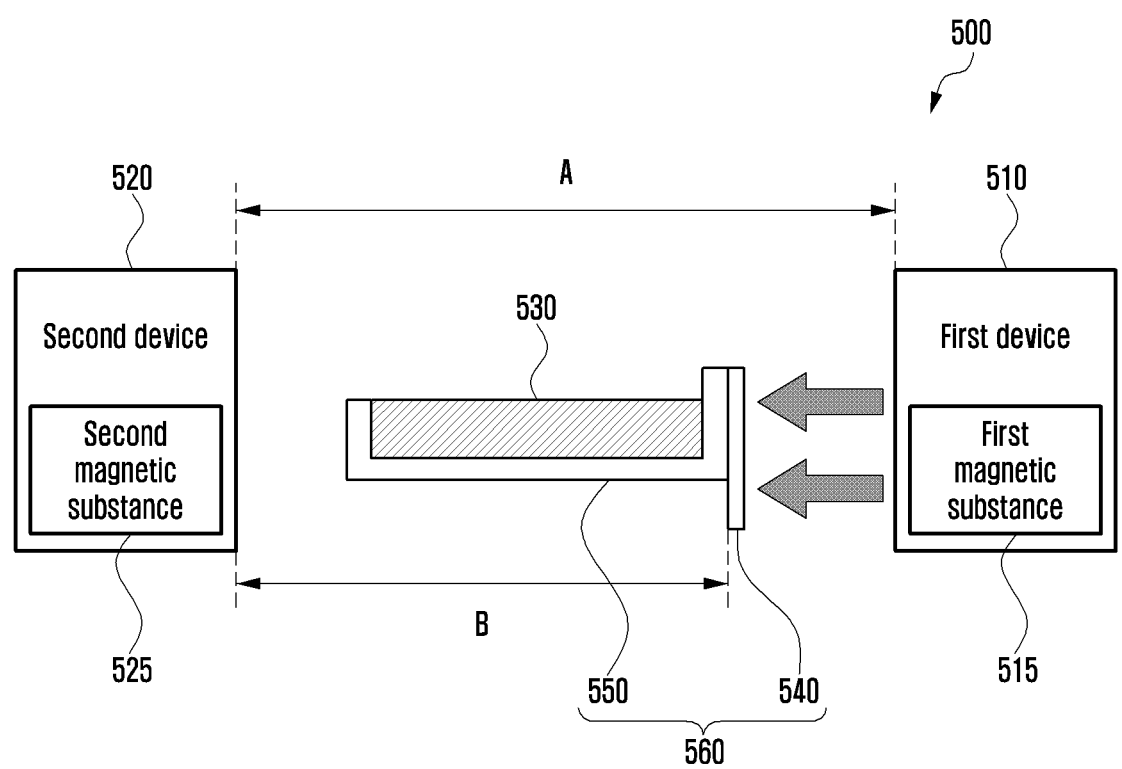
FIG. 5 is a diagram illustrating a shield structure for shielding a magnetic force from a device including a magnetic substance in an electronic device according to various embodiments of the disclosure.

FIG. 5 is a diagram illustrating a shield structure for shielding a magnetic force from a device including a magnetic substance in an electronic device according to various embodiments of the disclosure.

Referring to, FIG. 5 is a diagram schematically illustrating one side of the electronic components taken along line A-A' of FIG. 4.

Referring to FIG. 5, an electronic device 500 may include a first device 510 (e.g., the receiver 410 of FIG. 4) including a first magnetic substance 515, a second device 520 (e.g., the back-facing camera of FIG. 4) including a second magnetic substance 525, a circuit board 530 (e.g., the PCB 430 of FIG. 4), and a shield structure 560 for shielding at least part of a magnetic force generated between the first magnetic substance 515 and the second magnetic substance 525. In various embodiments, the first device 510 and the second device 520 include magnetic substances 515 and 525, respectively, but the disclosure is not limited thereto. Therefore, the disclosure may include a structure in which any one device (e.g., the first device 510) includes a magnetic substance (e.g., the first magnetic substance 515) and in which the other device (e.g., the second device 520) does not include a magnetic substance (e.g., the second magnetic substance 525). For example, in various embodiments, the disclosure may include a structure in which at least part of a magnetic force generated by the first magnetic substance 515 of the first device 510 is shielded not to affect the second device 520 that does not include a magnetic substance.

According to an embodiment, the shield structure 560 may include a magnetic force shield member (or shield portion) 540 for shielding a magnetic force and a connecting member (or connection portion) 550 for physically fixing the shield member 540 to the circuit board 530.

In various embodiments, the shield member 540 may be disposed between the first device 510 and the second device 520. The shield member 540 may be made of a shield material (or a first material metal or a magnetic material) capable of shielding at least part of a magnetic force generated between the first magnetic substance 515 and the second magnetic substance 525. According to an embodiment, the shield material may be a material (metal) including the property of a ferromagnetic material. For example, the shield material may be implemented with SUS (e.g., an element such as iron (Fe), cobalt (Co), and nickel (Ni) or an alloy).

In various embodiments, the connecting member 550 may contact (or physically connected to) at least part of the shield member 540 based on a portion of one side thereof and may contact (or physically connected to) and be fixed to the circuit board 530 based on the other side thereof. The connection member 550 may be made of a nonmagnetic material (or a second material metal) that may be magnetically separated from at least part of a magnetic force generated between the first magnetic substance 515 and the second magnetic substance 525. According to an embodiment, the nonmagnetic material may be a material (metal) that is not affected by a magnetic field formed by a magnetic substance (e.g., magnet). For example, the nonmagnetic material may be implemented using nickel silver (or pure iron).

In various embodiments, the shield structure 560 (e.g., the shield member 540, the connecting member 550) may be disposed (e.g., formed in a surface mount device (SMD) method) at the circuit board 530 in a particular manner to contact the circuit board 530. According to an embodiment, in implementing the shield structure 560, the shield structure 560 may be divided into the shield member 540 (e.g., material for magnetic field absorption (e.g., magnetic material)) for shielding a magnetic force and the connecting member 550 (e.g., non-magnetized material (e.g., nonmagnetic material), and a shield structure may be implemented by joining two materials (e.g., the shield member 540 and the connecting member 550). In the case of a shield structure according to various embodiments, the nonmagnetic material (e.g., the connecting member 550) formed with an SMD method may be designed to secure only a minimum area to be formed with an SMD method, thereby more freely designing a contact structure and/or position between the device (or a magnetic substance of the device) and the circuit board 530.

According to various embodiments, a disposition position (e.g., a position adjacent to any one device) of the shield member 540 may be determined according to whether functional characteristics (or driving (operation) method) of the device (e.g., the first device 510, the second device 520) are affected by a magnet (or magnetic force, magnetic field) between the first device 510 and the second device 520. According to an embodiment, the shield member 540 may be disposed closer (or leaned) to any one device (e.g., the first device 510 including a magnetic substance that affects an operation of another device) based on at least the functional characteristics of the first device 510 and the second device 520. According to an embodiment, the shield member 540 may have different structures in a distance and/or thickness from that of a device in which a disposition position is determined so as to correspond to the intensity (or magnetic force) of each magnetic substance between the first magnetic substance 515 and the second magnetic substance 525.

According to an embodiment, magnetic fluxes emitted from each of the magnetic substances (e.g., the first magnetic substance 515, the second magnetic substance 525) of electronic components (e.g., the first device 510 and the second device 520) of the electronic device 500 may be different in intensity thereof. For example, the first magnetic substance 515 provided in the first device 510 may have stronger magnetic properties than the second magnetic substance 525 provided in the second device 520. Further, the device may have a second driving method (or driving function) (e.g., an auto focus (AF) function of a camera, a zoom in/out function) affected by a magnetic flux of a magnetic substance of another device or the device may have a first drive method (e.g., a device that is not affected by other magnetic fluxes in driving, such as a speaker) that is not affected by a magnetic flux of a magnetic substance of another device. In an embodiment, a device including a first driving method and/or relatively strong magnetism may be referred to as a first device 510 and a device including a second driving method and/or relatively weak magnetism may be referred to as a second device 520.

According to an embodiment, a magnetic flux emitted from the second magnetic substance 525 of the second device 520 may not significantly affect an operation of the first device 510, but a magnetic flux emitted from the first magnetic substance 515 of the first device 510 may cause a serious error in an operation of the second device 520. According to an embodiment, the shield member 540 may absorb a magnetic force of the first magnetic substance 515 of the first device 510 to form a magnetic field with the first magnetic substance 515. Therefore, when a length B between the shield member 540 and the second device 520 (or the second magnetic substance 525 of the second device 520) is short (or as the shield member 540 and the second device 520 are disposed adjacent to each other, when the shield member 540 and the second device 520 belong to a magnetic field range), a magnetic flux emitted through the shield member 540 may affect an operation of the second device 520.

Therefore, the shield structure 560 of the electronic device 500 according to various embodiments may be disposed adjacent to a device of a first driving method and/or a device (e.g., the first device 510) that emits a relatively strong magnetic flux among the first device 510 and the second device 520.

According to an embodiment, as illustrated in FIG. 5, the shield structure 560 (in particular, the shield member 540) may be disposed closer to the first device 510 rather than the second device 520. Thereby, even within a fixed (or limited) length A between the first device 510 and the second device 520, a separation distance (e.g., length B) between the shield member 540 and the second magnetic substance 525 (e.g., a magnetic substance to be unshielded that may be affected by a magnetic force) may be maximally secured (e.g., maximum separation distance). According to an embodiment, a distance (e.g., length A) between the first device 510 and the second device 520 may include a first radius (e.g., about 15 mm, about 20 mm), and a distance (e.g., length B) between the shield member 540 and the second magnetic substance 525 may include a second radius (e.g., about 10 mm, about 15 mm) smaller than the first radius.

Hereinafter, a structure of the shield structure 560 for shielding a magnetic force in the electronic device 500 according to various embodiments will be described in detail. In the following description, for convenience of description, it is described that the first device 510 and the second device 520 each include a magnetic substance, but in a structure in which only the first device 510 includes a magnetic substance and in which the second device 520 does not include a magnetic substance, the electronic device 500 may include a structure that shields at least part of a magnetic force generated by the magnetic substance of the first device 510.

FIGS. 6, 7, 8, and 9 are diagrams illustrating a structure for shielding a magnetic force from a device including a magnetic substance in an electronic device according to various embodiments of the disclosure.

Figure 6:
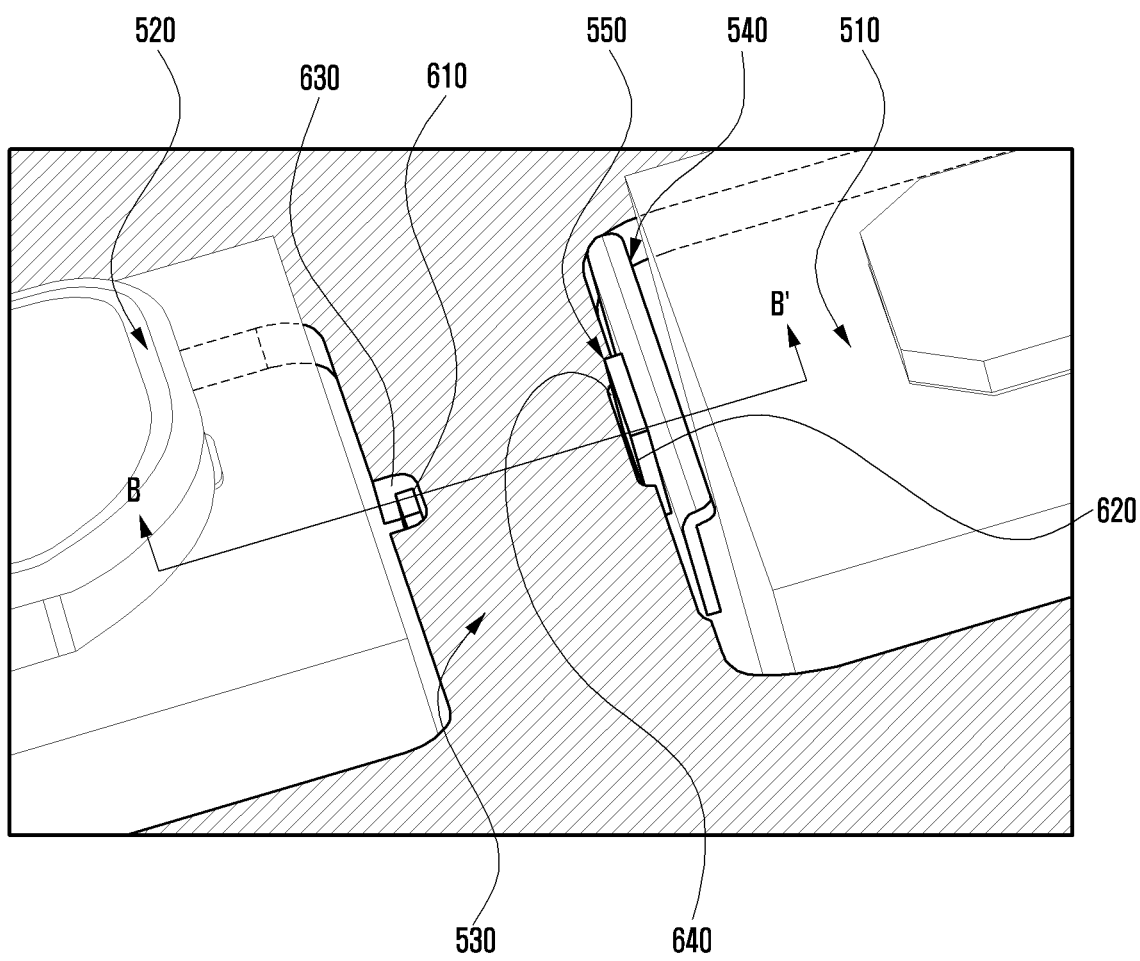
FIG. 6 is a plan perspective view illustrating a shield structure coupled to a circuit board according to various embodiments of the disclosure.
Figure 7:
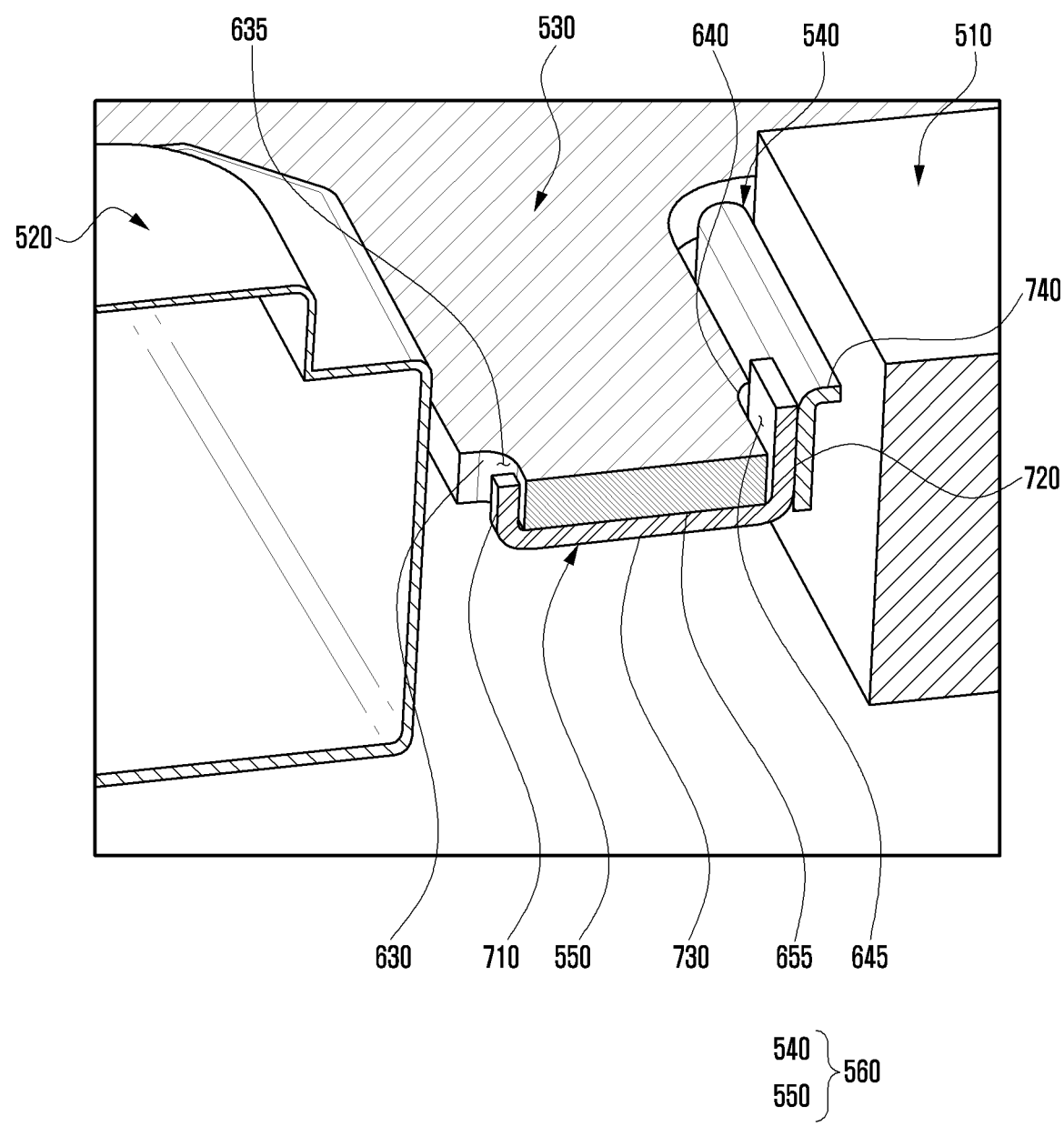
FIG. 7 is a cut-away perspective view illustrating the shield structure taken along line B-B' of FIG. 6 according to an embodiment of the disclosure.
Figure 8:
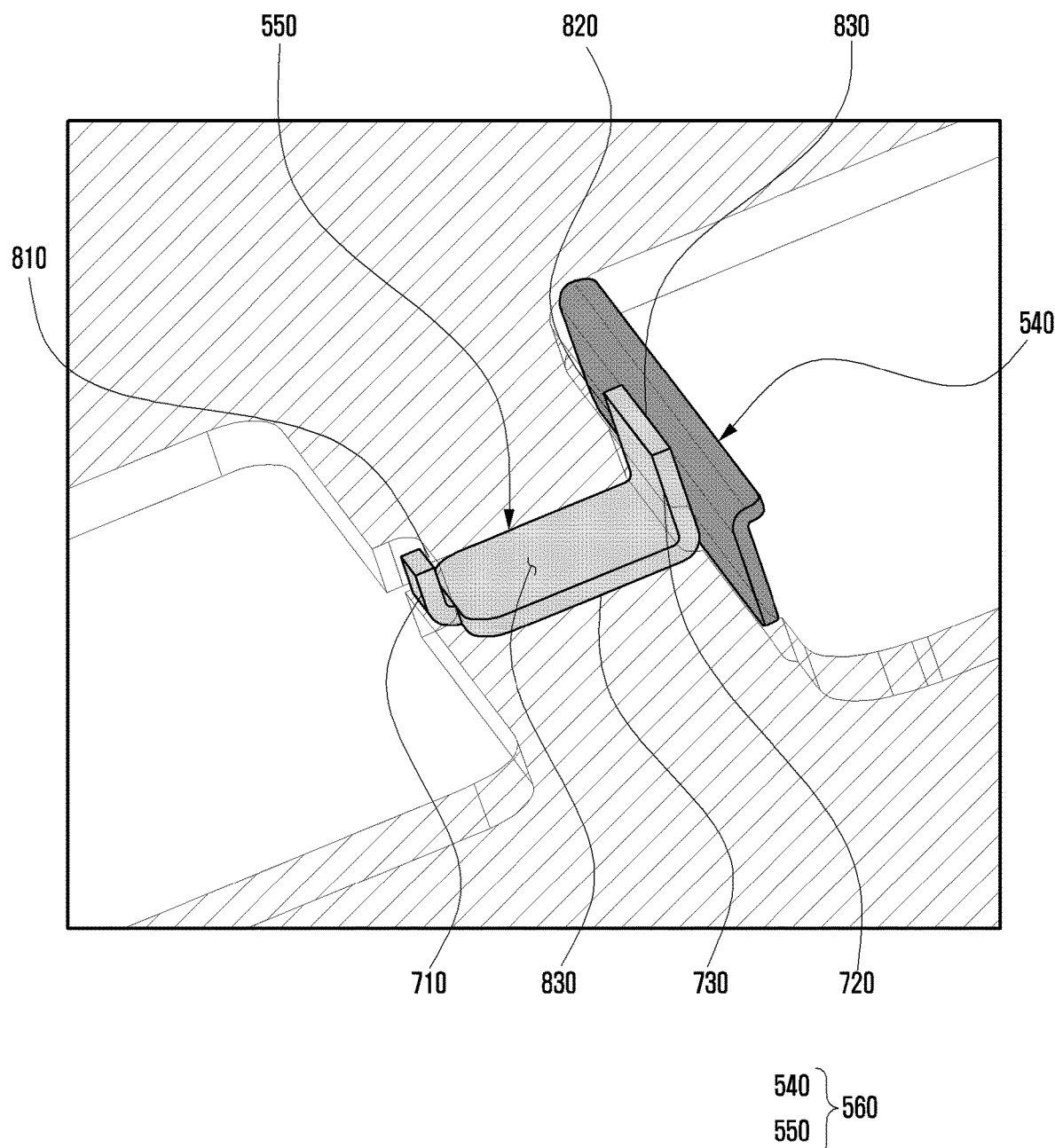
FIG. 8 is a projection perspective view illustrating a state in which the shield structure contacts the circuit board of FIG. 6 according to an embodiment of the disclosure.
Figure 9:
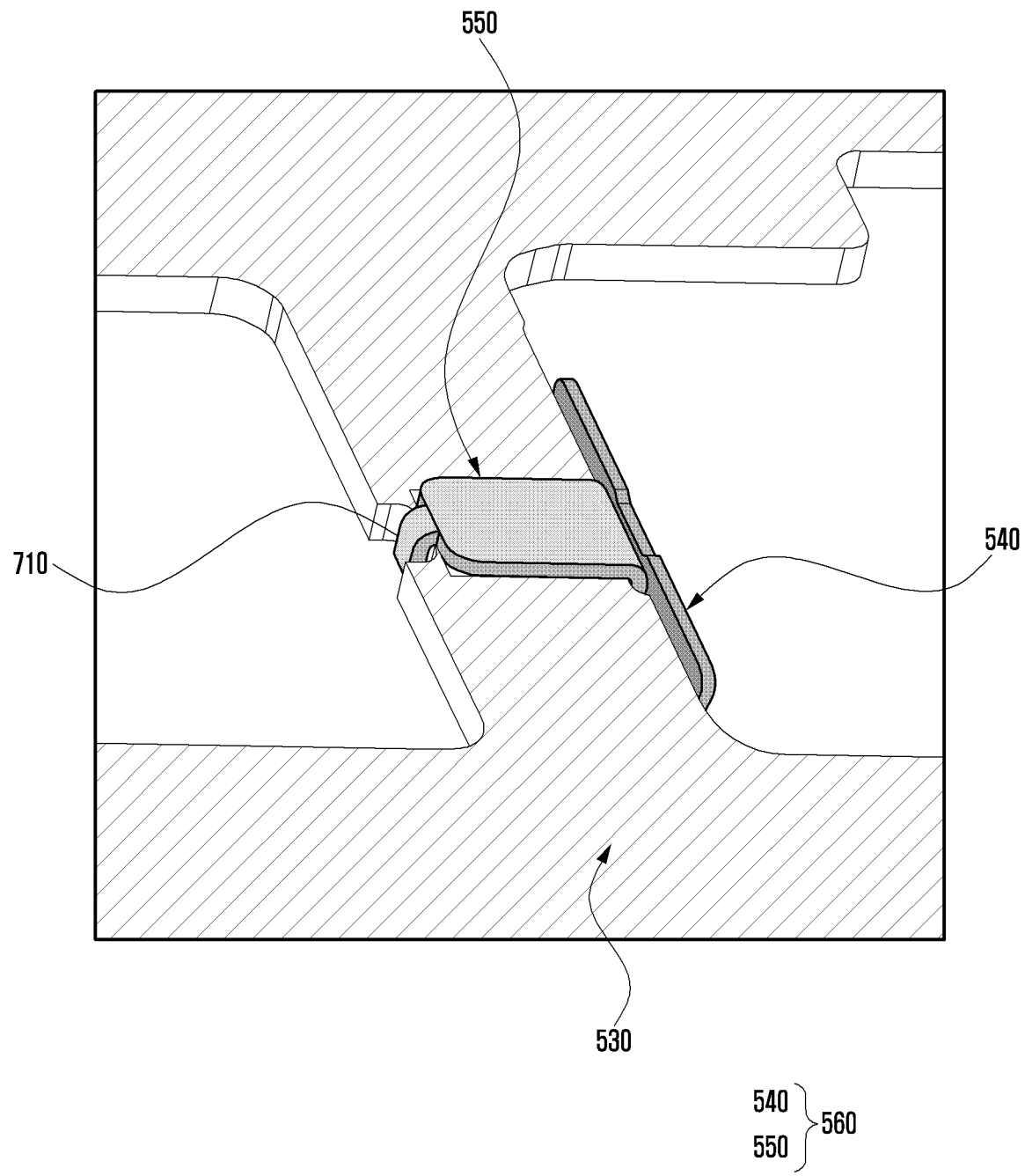
FIG. 9 is a rear perspective view illustrating a state in which the shield structure contacts the circuit board of FIG. 6 according to an embodiment of the disclosure.

Referring to, FIG. 6 is a plan perspective view illustrating an example in which the shield structure 560 (e.g., the shield member 540, the connecting member 550) is disposed between two devices (e.g., the first device 510, the second device 520) and contacts (or is coupled to) the circuit board 530. FIG. 7 is a cut-away perspective view taken along line B-B' of FIG. 6. FIG. 8 is a diagram illustrating a projection perspective view illustrating a form in which the shield structure 560 contacts (or is connected to) the circuit board 530 in FIG. 6. FIG. 9 is a rear perspective view illustrating a form in which the shield structure 560 contacts the circuit board 530 in FIG. 6.

A contact (connection) structure of the shield structure 560 and the circuit board 530 will be described with reference to FIG. 6.

Referring to FIG. 6, the first device 510 is an electronic component including the first magnetic substance 515; and, in an embodiment, the first device 510 may correspond to a receiver or a speaker. The second device 520 is an electronic component including the second magnetic substance 525; and, in an embodiment, the second device 520 may correspond to a camera. In various embodiments, the device may correspond to various electronic components (e.g., a magnetic sensor, an acceleration sensor) including a magnetic substance in addition to the above-described electronic components.

According to an embodiment, when at least two devices (e.g., the first device 510 and the second device 520) are mounted adjacent to each other in the electronic device 500, at least two magnetic substances (e.g., the first magnetic substance 515 and the second magnetic substance 525) of the devices 510 and 520 may affect the other device in any one direction or the other device in both directions. Accordingly, an error may occur in an operation of the devices 510 and 520. To prevent such an error, the shield member (e.g., the shield members 540 of FIGS. 6 to 9) made of a conductive material (e.g., SUS, ferrite) may be disposed between the devices 510 and 520.

According to an embodiment, the circuit board 530 may form a first groove 630 in which one end (e.g., a first member (or a first reinforcing member) 610 of a connecting member (e.g., a connecting member 550 of FIGS. 6 to 9) may contact one side (e.g., the left side of the circuit board 530 in a viewing direction of FIG. 6) thereof and a second groove 640 in which the other end (e.g., a second member (or second reinforcing member) 620 of the connecting member 550 may contact the other side (the right side surface of the circuit board 530 in a viewing direction of FIG. 6) of an opposite direction of one side.

According to an embodiment, the first groove 630 and the second groove 640 may have a structure including a width of different sizes. For example, the first groove 630 and the second groove 640 may be formed in a structure corresponding to one end (e.g., the first reinforcing member 610) and the other end (e.g., the second member 620) of the contact connecting member 550. According to an embodiment, the first groove 630 may have a width (e.g., a width at which the first reinforcing member 610 may be seated) corresponding to one end (e.g., the first reinforcing member 610) of the connecting member 550, and the second groove 640 may have a width (e.g., a width at which the second reinforcing member 620 may be seated) corresponding to the other end (e.g., the second reinforcing member 620) of the connecting member 550. For example, in FIGS. 6 to 9, the first groove 630 may be relatively smaller than the second groove 640, and the second groove 640 may have a relatively larger width than that of the first groove 630. According to some embodiments, the circuit board 530 may not have the first groove 630 and the second groove 640 and may have a structure that contacts (or adheres to) the connecting member 550 through a lower surface of the circuit board 530.

A structure of the shield structure 560 will be described with reference to FIGS. 6 to 9.

The shield structure 560 may include a shield member 540 including a magnetic property and a connecting member 550 including a nonmagnetic property. According to an embodiment, the shield structure 560 may include a shield member 540 (e.g., a magnetic substance) for shielding a magnetic force and a connecting member 550 for fixing the shield member 540 to the circuit board 530. According to an embodiment, the shield structure 560 may be made of a heterogeneous material such as the shield member 540, which is a magnetic substance, and the connecting member 550, which is a nonmagnetic substance; and the heterogeneous materials are bonded to the circuit board 530 by an SMD method. For example, the shield member 540 may have a property of a ferromagnetic substance capable of shielding a magnetic force, and the connecting member 550 may have a property of a nonmagnetic substance that may be magnetically separated from a magnetic force.

Referring to FIG. 7, the shield member 540 may have a plate-like structure and may contact (physically fixed to) one side of the circuit board 530 through the connecting member 550. According to an embodiment, the shield member 540 may have a bending structure including a first bending portion 740 (e.g., an upper portion in a longitudinal direction in the drawing) and/or a second bending portion (e.g., a lower portion in a longitudinal direction in the drawing). For example, the shield member 540 may be at least partially bent.

According to an embodiment, the bending portion (e.g., the first bending portion 740) of the shield member 540 may have a shape bent in a predetermined direction. According to an embodiment, a bending structure of the shield member 540 may be designed in a shape "⌐" or a shape "⌙" by bending an upper side portion or a lower side portion or may be designed in a shape "⊏" by bending an upper side portion and a lower side portion. For example, the number of bending portions of the shield member 540 may be plural. FIGS. 6 to 9 illustrate an example in which an upper portion of the shield member 540 is designed in a bending structure.

According to an embodiment, the bending portion (e.g., the first bending portion 740) bent in the shield member 540 may be formed in an outward direction of the circuit board 530, for example, in a direction of a device (or magnetic substance of the device) to be shielded. According to an embodiment, a bending angle and a bending direction of the bending portion may be variously implemented according to the magnitude (magnetic force) and/or a size (e.g., height) of the magnetic substance to be shielded. According to an embodiment, the shield member 540 may not include a bending portion or may be bent in a predetermined angle (e.g., 90°, 120°, 150°) (or radius of curvature). According to an embodiment, an entire height (or length) and/or area of the shield member 540 may be the same as or relatively larger than a size (e.g., height and/or area) of the magnetic substance to be shielded. Thereby, larger effects can be expected in formation of a magnetic field with the magnetic substance to be shielded and shielding of a magnetic force.

According to an embodiment, the shield member 540 may be designed to have a variable thickness according to a magnetic force of a magnetic substance to be shielded. For example, the shield member 540 may be designed in a thickness to sufficiently absorb magnetism of the magnetic substance to be shielded. According to an embodiment, the shield member 540 may have a thickness of about 0.15 mm.

According to an embodiment, the shield member 540 may contact (be connected to) the circuit board 530 in an SMD method based on the connecting member 550.

Referring to FIGS. 7, 8, and 9, at one side (e.g., an upper side) of the circuit board 530, at least one electronic component may be provided, and the connecting member 550 contacts the other side (a lower surface 655) of the circuit board 530. According to an embodiment, the connecting member 550 may have a shape that encloses the circuit board 530 in a concave ("凹") shape (or "U" shape) structure. According to an embodiment, the connecting member 550 may contact fixing grooves (e.g., the first groove 630, the second groove 640) of both sides (e.g., a portion 635 of the left side and a portion 645 of the right side) of the circuit board 530 and a portion of the lower surface 655 of the circuit board 530.

According to an embodiment, the connecting member 550 may be, for example, a reinforcing member formed with a plurality of portions (e.g., a first portion, a second portion, and a third portion) divided according to a shape and/or function thereof. According to an embodiment, the connecting member 550 may be divided into a first reinforcing member 710 (e.g., vertical member, bar member) that is a first portion of the reinforcing member and for fixing to the first groove 630 of one side of the circuit board 530, a second reinforcing member 720 that is a second portion of the reinforcing member and for fixing to the circuit board 530 through the second groove 640 of the other side of the circuit board 530, or a third reinforcing member 730 (e.g., a bottom member) that is a third portion of the reinforcing member and that contacts the lower surface 655 of the circuit board 530.

According to an embodiment, the first reinforcement member 710 (e.g., a first portion of the reinforcement member) and the second reinforcement member 720 (e.g., a second portion of the reinforcement member) may be fixed vertically to both sides of the third reinforcing member 730 (e.g., a third portion of the reinforcement member). For example, the connecting member 550 may be formed such that the first portion (first region) is disposed to correspond to the first groove 630 of the circuit board 530, the second portion (second region) is disposed to correspond to the second groove 640 of the circuit board 530, and a third portion (third region) contacts a lower surface of the circuit board 530. According to an embodiment, the connecting member 550 may be formed such that the first reinforcing member 710 (e.g., the first portion of the reinforcing member), the second reinforcing member 720 (e.g., the second portion of the reinforcing member), and the third reinforcing member 730 (e.g., the third portion of the reinforcing member) each have different functions (or have different shapes).

According to an embodiment, in the connecting member 550, one surface 810 (e.g., an inner surface) of the first reinforcing member 710 of one end may contact the first groove 630 of the circuit board 530, and at least one surface 820 (e.g., a partial area of the inner surface side) of the second reinforcing member 720 of the other end may contact the second groove 640 of the circuit board 530. According to an embodiment, the shield member 540 may contact the entirety of the other surface 830 (e.g., outer surface) of the second reinforcing member 720. For example, one side of the connecting member 550 may contact the other surface 830 of the second reinforcing member 720.

According to an embodiment, the first reinforcement member 710 and the second reinforcement member 720 may have different widths and lengths (or heights). According to an embodiment, in FIGS. 6 to 9, the first reinforcing member 710 may have relatively smaller width and length than the second reinforcing member 720, and the second reinforcing member 720 may have a relatively larger width and length (e.g., a structure including a wide width and a long length) than the first reinforcing member 710. For example, the second reinforcing member 720 may contact in a larger area in consideration of bending prevention and contact force of the shield member 540.

According to an embodiment, the first reinforcement member 710 may have a height corresponding to (or equal to) a height of the circuit board 530 (e.g., an upper surface of the circuit board 530). The second reinforcing member 720 may protrude in a height higher than that of the circuit board 530 (e.g., a structure protruding from an upper surface of the circuit board 530). For example, the second reinforcing member 720 may have a relatively larger area than the first reinforcing member 710 in consideration of a contact area with the shield member 540. Through such a structure shape, one side (e.g., the inner side) of the second reinforcing member 720 may be fixed to and contact the circuit board 530, and the other side (e.g., the outer side) thereof may be more stably fixed to and contact the shield member 540.

According to an embodiment, the third reinforcing member 730 may have a shape in which the entire upper surface 830 (or the inner surface) contacts the circuit board 530.

FIGS. 10 to 14 illustrate various embodiments of a shield structure according to various embodiments of the disclosure. According to an embodiment, a circuit board (e.g., PCB) may have a relatively small width w between (e.g., a weak part) at least two devices (e.g., a first device, a second device) and may be more easily damaged than other portions of the circuit board. In various embodiments, a shield structure (e.g., shield member, connecting member) may reinforce a narrowly formed portion (e.g., a weak part) between the devices. According to an embodiment, in the circuit board, a shield structure may be disposed in a portion that may benefit from reinforcement (e.g., a weak part), and the shield structure may reinforce the weak part based on an elongated plate-like structure or a bending structure bent in a predetermined angle (e.g., about 90°). According to an embodiment, the connecting member of the shield structure may function as a member for reinforcing strength.

Figure 10:
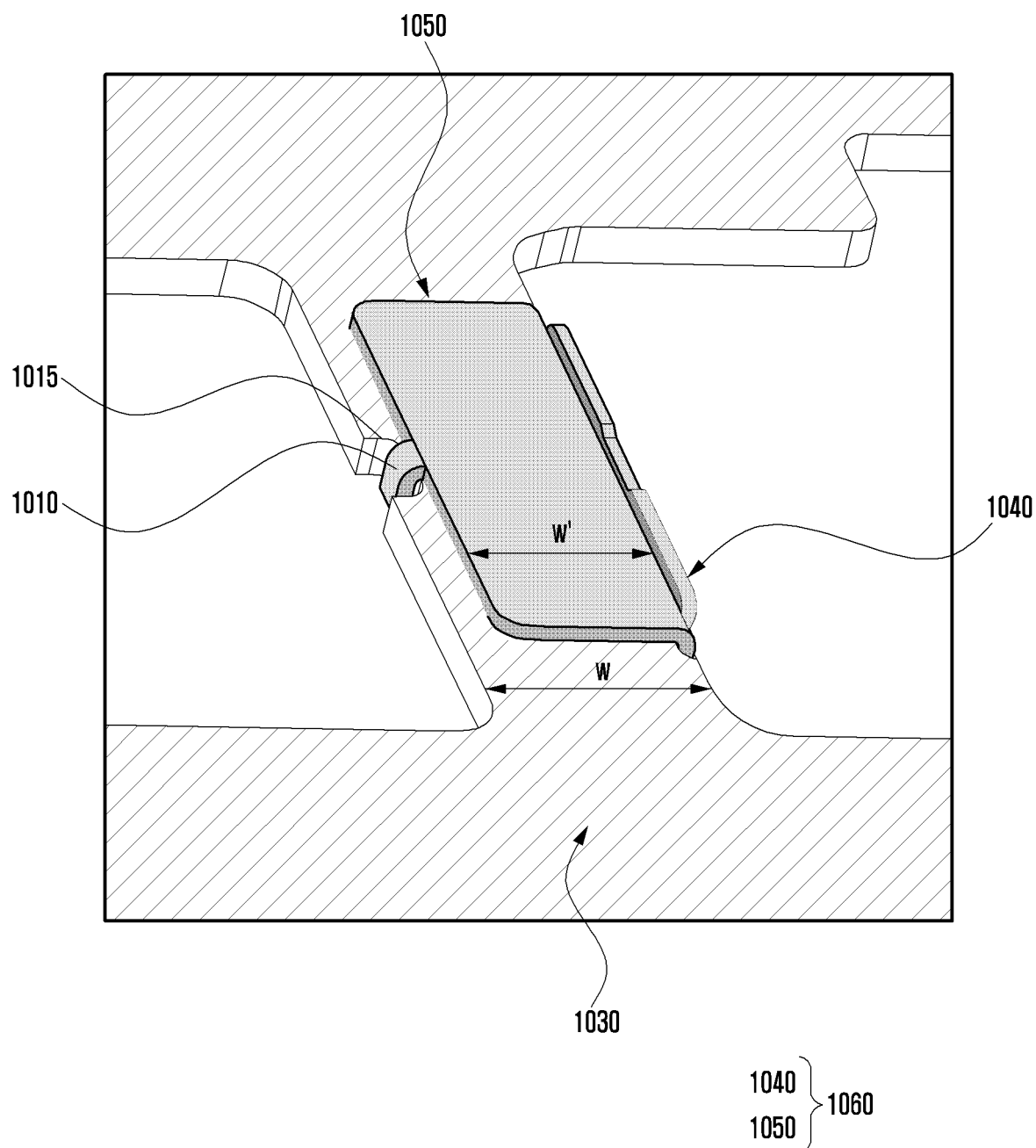
FIG. 10 is a rear perspective view illustrating another form of a shield structure contacting a circuit board according to various embodiments of the disclosure.

FIG. 10 is a rear perspective view illustrating another form of a shield structure contacting a circuit board according to various embodiments of the disclosure.

FIG. 10 illustrates another form of the shield structure 560 (e.g., the shield member 540 and the connecting member 550) described in the foregoing description with reference to FIGS. 5 to 9. According to an embodiment, as illustrated in FIG. 10, a shield structure 1060 (e.g., a shield member 1040, a connecting member 1050) may have a shape (or structure) corresponding to the shield structure 560 according to the foregoing example and further have a function (e.g., a member for reinforcing strength) for reinforcing strength of the circuit board 1030 using the connecting member 1050.

Referring to FIG. 10, in a circuit board 1030, one end and the other end of the connecting member 1050 may contact through one side of a circuit board 1030 between at least two devices (e.g., a first device (not illustrated), a second device (not illustrated)) and the other side of an opposite direction of one side. According to an embodiment, the circuit board 1030 may further have grooves (e.g., the first groove 630 of FIG. 6, the second groove 640 of FIG. 6) for fixing the connecting member 1050 to at least one of one side or the other side. According to an embodiment, FIG. 10 illustrates an example in which a groove is formed in which one end (e.g., a first member 1010) of the connecting member 1050 may contact any one side (e.g., the left side of the circuit board 1030 in a viewing direction of FIG. 10) of the circuit board 1030.

According to an embodiment, the shield member 1040 of the shield structure 1060 may correspond to the description of the shield member 540 described with reference to FIGS. 5 to 9, and a detailed description thereof will be omitted.

According to an embodiment, the connecting member 1050 of the shield structure 1060 may be extended longer than the connecting member 550 described with reference to FIGS. 5 to 9 to have a length (or width) longer than the connecting member 550. According to an embodiment, in the circuit board 1030, a portion (hereinafter, weak part) between two devices (e.g., a first device (not illustrated), a second device (not illustrated)) may have relatively weaker strength than that of other portions of the circuit board 1030 because of a narrow width w. In various embodiments, the connecting member 1050 of the shield structure 1060 may be used as a reinforcing member for reinforcing strength of the weak part of the circuit board 1030. For example, the connecting member 1050 may function as a member for reinforcing strength.

According to an embodiment, as illustrated in FIG. 10, the connecting member 1050 may be elongated in a direction corresponding to a longitudinal direction of a weak part of the circuit board 1030 to have a shape that covers at least part (e.g., all or some) of the weak part. As illustrated in FIG. 10, in the circuit board 1030, the connecting member 1050 may be formed inward (e.g., a shape in which the weak part and the connecting member 1050 have a step) by a width of a groove 1015 in which one end (e.g., the first member 1010) thereof may contact to have a width w' smaller than a width w of the weak part. According to an embodiment, a length of the connecting member 1050 may correspond to that of the weak part or may be shorter or longer than that of the weak part according to a fastening structure of the connecting member 1050. According to an embodiment, the connecting member 1050 may have a shape corresponding to that of the weak part.

According to various embodiments, the connecting member 1050 may be disposed in the circuit board 1030 in a specific manner (e.g., formed in a SMD method) to contact the circuit board 1030. In the case of a shield structure according to various embodiments, the nonmagnetic material (e.g., the connecting member 1050) formed with an SMD method may be designed to secure a maximum area (or larger area) to be formed with an SMD method, thereby reinforcing strength of the weak part between the device and the device in the circuit board 1030.

Figure 11:
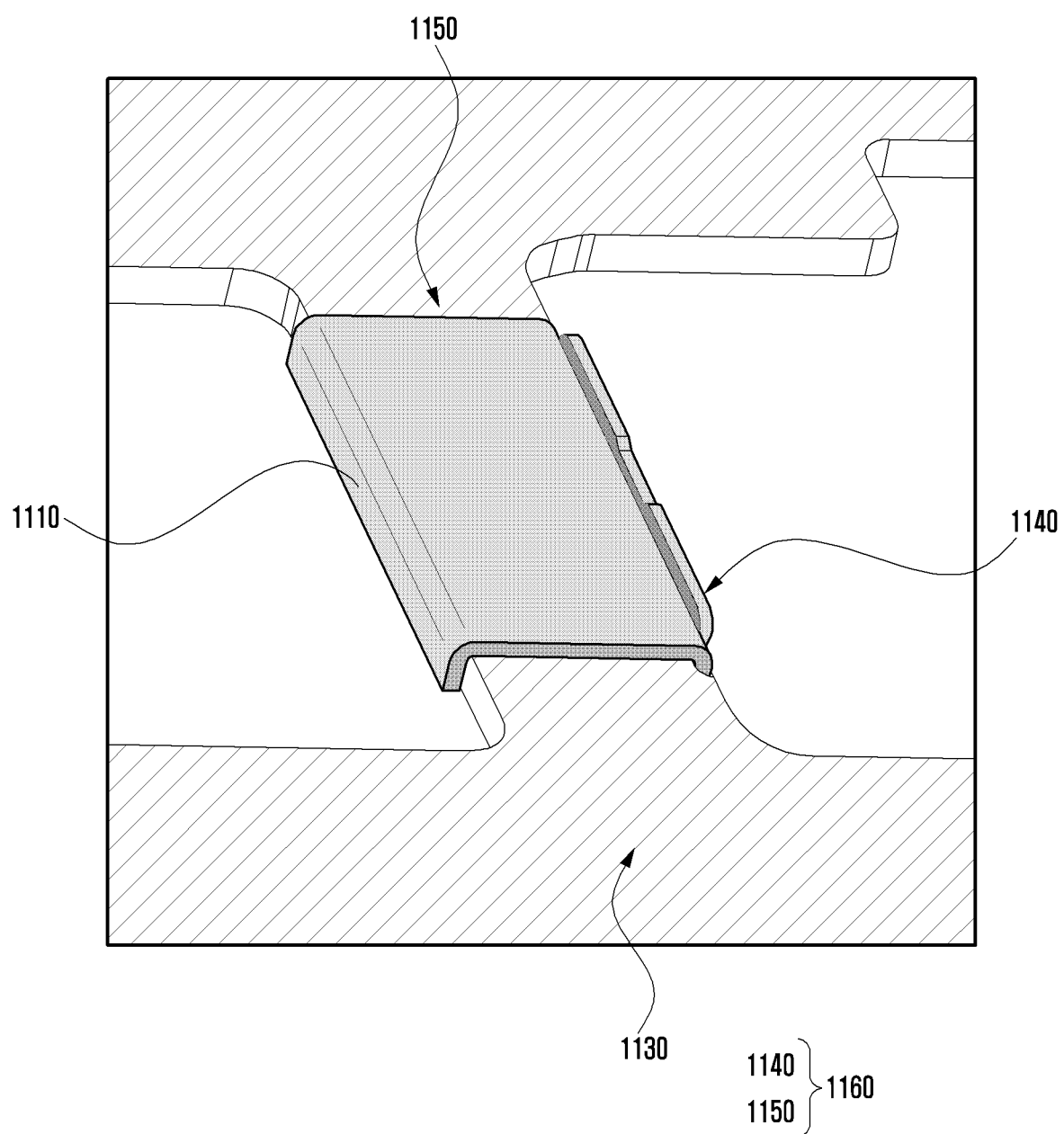
FIG. 11 is a rear perspective view illustrating another form of a shield structure contacting a circuit board according to various embodiments of the disclosure.

FIG. 11 is a rear perspective view illustrating another form of a shield structure contacting a circuit board according to various embodiments of the disclosure.

FIG. 11 illustrates another form of the shield structure 1060 described with reference to FIG. 10. For example, FIG. 11 illustrates an example of another structure of a connecting member 1150 of a shield structure 1160.

Referring to FIG. 11, in a circuit board 1130, one end and the other end of the connecting member 1150 may contact through one side of the circuit board 1130 between at least two devices (e.g., a first device (not illustrated), a second device (not illustrated)) and the other side, respectively of opposite side of the one side. According to an embodiment, FIG. 11 illustrates an example of a structure in which the circuit board 1130 contacts the connecting member 1150 through one side and the other side without forming grooves in one side and the other side.

According to an embodiment, a shield member 1140 of the shield structure 1160 may correspond to that described with reference to FIGS. 5 to 10, and a detailed description thereof will be omitted.

According to an embodiment, the connecting member 1150 of the shield structure 1160 has an extended width further than that of the connecting member 1050 described with reference to FIG. 10, and a first member 1110 contacting any one side (e.g., the left side of the circuit board 1130 in a viewing direction of FIG. 11) of the circuit board 1130 may have a length corresponding to that of the connecting member 1050. According to an embodiment, the connecting member 1150 may have an extended length by a height of the side surface of the circuit board 1130 at one end of the weak part of the circuit board 1130. According to an embodiment, the first member 1110 may have a structure in which an extended portion of the connecting member 1150 is bent at the end (or edge portion) of a width w of the weak part.

According to an embodiment, as illustrated in FIG. 11, the connecting member 1150 may have a length corresponding to that of the weak part of the circuit board 1130 and have a width corresponding to a width w of the weak part to be formed in a shape (or covering an entire weak part) including an area corresponding to the weak part.

Figure 12:
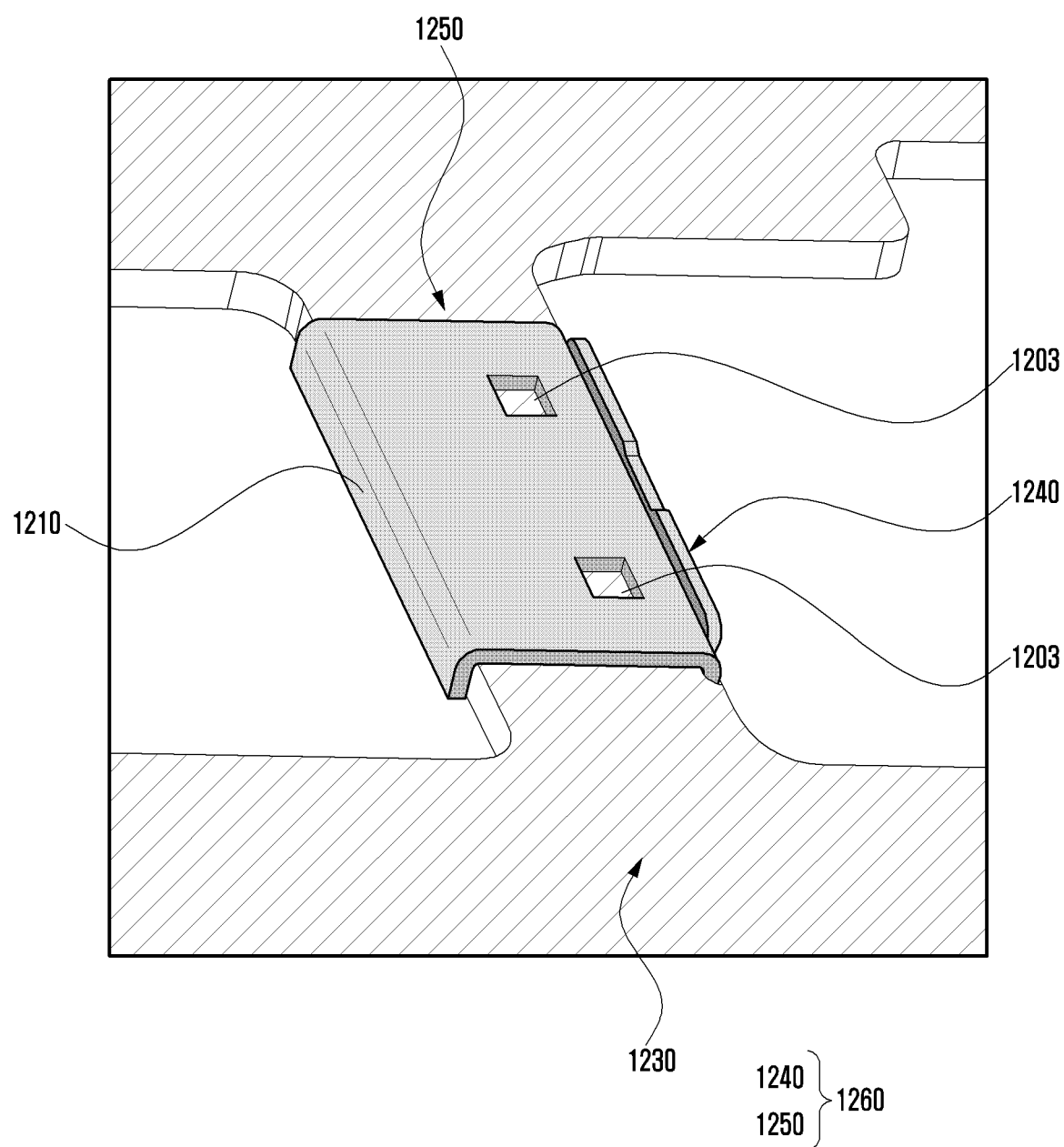
FIG. 12 is a rear perspective view illustrating another form of a shield structure contacting a circuit board according to various embodiments of the disclosure.

FIG. 12 is a rear perspective view illustrating another form of a shield structure contacting a circuit board according to various embodiments of the disclosure.

FIG. 12 illustrates another form of the shield structure 1160 described with reference to FIG. 11. For example, FIG. 12 illustrates an example of another structure of a connecting member 1250 of a shield structure 1260.

Referring to FIG. 12, a circuit board 1230 may include at least one circuit terminal (or contact portion) (e.g., GND terminal) related to at least one device (e.g., a first device (not illustrated), a second device (not illustrated)). According to an embodiment, the circuit board 1230 may include a circuit terminal for electrical connection of a particular device (e.g., a speaker) in the weak part. FIG. 12 illustrates an example in which a hole 1203 for electrical wiring connection is formed at a position corresponding to a circuit terminal formed in a weak part in the connecting member 1250.

According to an embodiment, a shield member 1240 of the shield structure 1260 may correspond to that described with reference to FIGS. 5 to 10, and a detailed description thereof will be omitted.

According to an embodiment, FIG. 12 illustrates an example in which two circuit terminals (e.g., GND terminals) for electrical connection with a device are formed in the weak part of the circuit board 1230. According to an embodiment, the connecting member 1250 may have two holes 1203 at positions corresponding to each position of the circuit terminals. According to an embodiment, a connection wiring from the device may be connected to circuit terminals of the circuit board 1230 exposed through two holes 1203 of the connecting member 1250. According to an embodiment, as illustrated in FIG. 12, when an area of the connecting member 1250 decreases in order to avoid a circuit terminal, as illustrated in FIG. 11 or 12, a first member 1210 of the connecting member 1250 is extended by a height of the circuit board 1230 (or the weak part) and a portion (e.g., the first member 1210) extended by the height is bent at the end in the width direction of the weak part, thereby reinforcing strength of the weak part.

Figure 13:
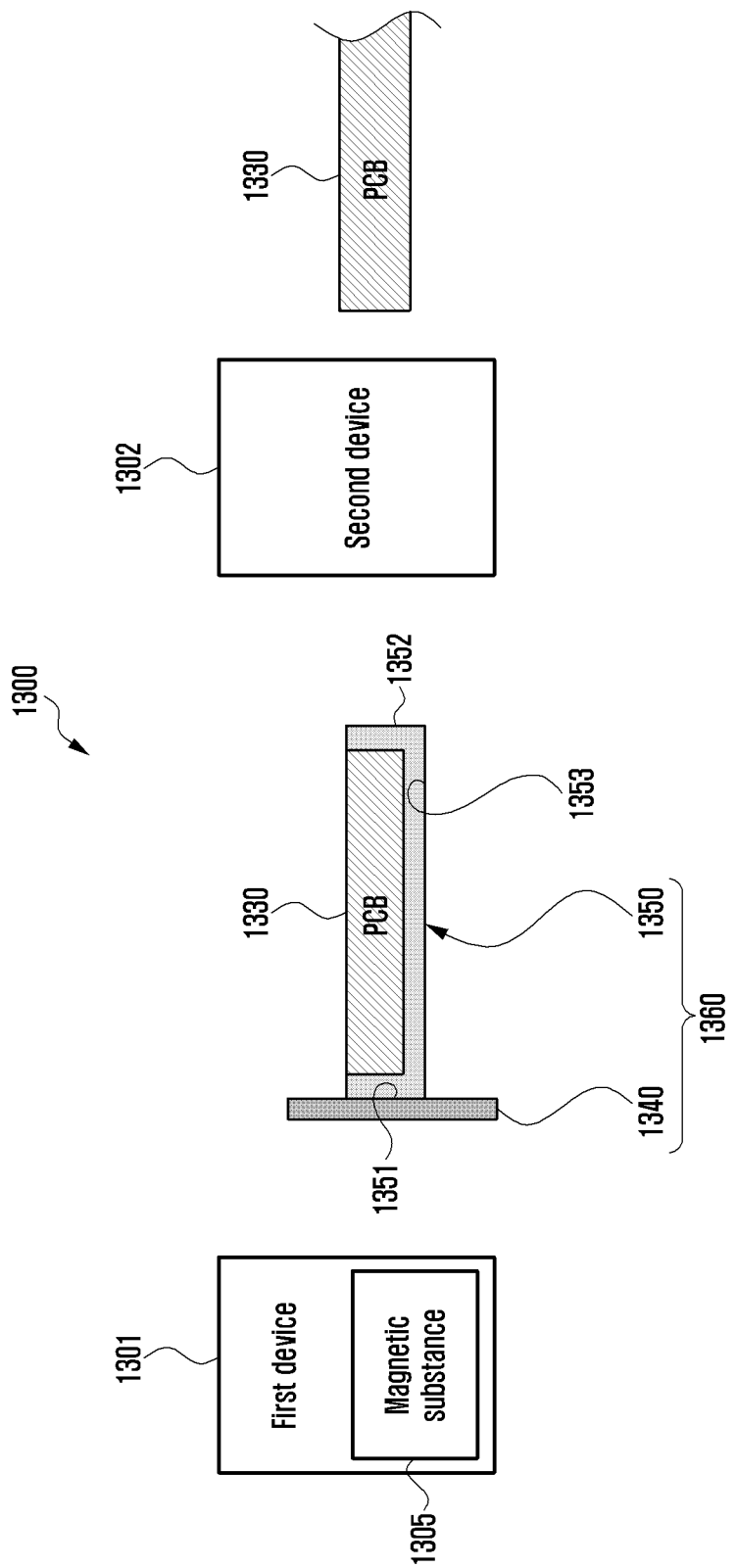
FIGS. 13 and 14 are diagrams illustrating a shield structure for shielding a magnetic force from a device including a magnetic substance in an electronic device according to various embodiments of the disclosure.
Figure 14:
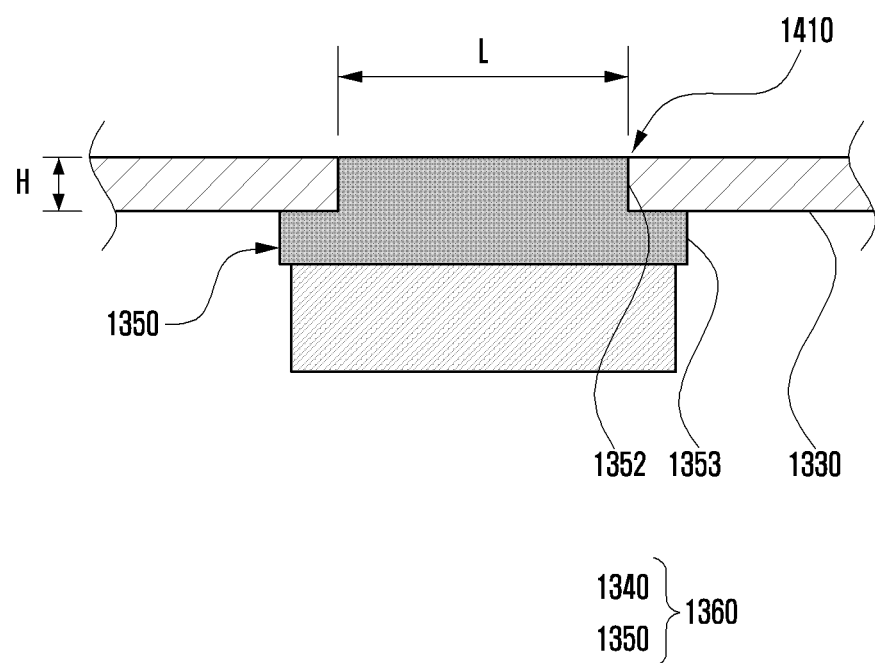

FIGS. 13 and 14 are diagrams illustrating a shield structure for shielding a magnetic force from a device including a magnetic substance in an electronic device according to various embodiments of the disclosure.

Referring to, FIG. 13 is a diagram schematically illustrating one side of electronic components cut in any one direction in a state in which the device is seated in FIGS. 10 to 12.

Referring to FIG. 13, an electronic device 1300 may include a first device 1301 (e.g., the receiver 410 of FIG. 4) including a magnetic substance 1305, a second device 1302 (e.g., the second device 420 of FIG. 4) that does not include a magnetic substance, a circuit board 1330 (e.g., the PCB 430 of FIG. 4), and a shield structure 1360 for shielding at least part of a magnetic force generated between the first device 1301 and the second device 1302. In various embodiments, the first device 1301 includes a magnetic substance 1305, but the disclosure is not limited thereto. According to various embodiments, the first device 1301 and the second device 1302 each may include a structure including a magnetic substance. For example, the electronic device 1300 of the disclosure may include a structure in which one device (e.g., the first device 1301) includes a magnetic substance, and the other device (e.g., the second device 1302) does not include a magnetic material, or a structure in which one device and at least one other device each include a magnetic substance.

In various embodiments, the electronic device 1300 may include a structure in which at least part of a magnetic force generated by the magnetic substance 1305 of the first device 1301 is shielded so as not to affect at least one second device 1302 affected by the magnetic substance 1305.

According to an embodiment, the shield structure 1360 may include a shield member 1340 for shielding a magnetic force and a connecting member 1350 for physically fixing the shield member 1340 to the circuit board 1330.

In various embodiments, the shield member 1340 may be disposed between the first device 1301 and the second device 1302. The shield member 1340 may be made of a shield material (or first material metal or magnetic material) capable of shielding at least part of a magnetic force between the first device 1301 (or the magnetic substance 1305 of the first device 1301) and the second device 1302. According to an embodiment, the shield material may be a material (metal) including a property of a ferromagnetic material. For example, the shield material may be implemented with SUS (e.g., made of an element or alloy such as iron (Fe), cobalt (Co), and nickel (Ni)).

In various embodiments, the connection member 1350 may contact (or be physically connected to) at least part of the shield member 1340 based on a portion of one side (e.g., the outer side) and may contact (or be physically connected to) the circuit board 1330 based on the other side (e.g., the inner side). According to an embodiment, the connecting member 1350 may be made of a nonmagnetic material (or a second material metal) that may be magnetically separated from at least part of a magnetic force generated between the first device 1301 (or the magnetic substance 1305 of the first device 1301) and the second device 1302. According to an embodiment, the nonmagnetic material may be a material (metal) that is not affected by a magnetic field formed by the magnetic substance (e.g., magnet). For example, the non-magnetic material may be implemented using nickel silver (or pure iron).

According to various embodiments, the shield structure 1360 (e.g., the shield member 1340, the connecting member 1350) may be disposed (e.g., formed with an SMD method) in the circuit board 1330 in a particular manner to contact the circuit board 1330. According to an embodiment, in implementing the shield structure 1360, the shield member 1340 (e.g., a material for absorbing a magnetic field (e.g., magnetic material) for shielding a magnetic force and the connecting member 1350 (e.g., non-magnetized material (e.g., nonmagnetic material)) may be divided and by bonding between two materials (e.g., the shield member 1340 and the connecting member 1350), a shield structure may be implemented. In the case of a shield structure according to an embodiment, a nonmagnetic material (e.g., the connecting member 1350) to be formed with an SMD method may be designed to secure a minimum area to be formed with an SMD method; thus, a contact structure and/or position between the device (or the magnetic substance of the device) and the circuit board 1330 may be more freely designed. In the case of a shield structure according to an embodiment, a nonmagnetic material (e.g., the connecting member 1350) be formed with an SMD method may be designed to secure a maximum area (e.g., a junction area to be formed with an SMD method in the circuit board 1330) to be formed with an SMD method. Thereby, in various embodiments, the strength of a weak part of the circuit board 1330 may be reinforced (e.g., twist is reinforced), and the connecting member 1350 may be bonded to the circuit board 1330 in a larger area to prevent from separation from the circuit board 1330 of the shield structure 1360.

According to various embodiments, a disposition position (e.g., a position adjacent to a device of any one side) of the shield member 1340 may be determined according to whether functional characteristics (or driving (operation) method) of the device (e.g., the first device 1301, the second device 1302) are affected by a magnet (or magnetic force or magnetic field) between the first device 1301 and the second device 1302. According to an embodiment, the shield member 1340 may be disposed closer (or leaned) to any one device (e.g., the first device 1301 including a magnetic substance that affects an operation of the other device) based on at least functional characteristics of the first device 1301 and the second device 1302. According to an embodiment, the shield member 1340 may have a distance and/or thickness different from the device in which the disposition position is determined to correspond to the magnitude (or magnetic force) of the magnetic substance between the magnetic substance 1305 of the first device 1301 and the second device 1302 (or a magnetic substance (not illustrated) of the second device 1302).

The shield structure 1360 of the electronic device 1300 according to various embodiments may be disposed adjacent to a device (e.g., the first device 1301) that emits a relatively strong magnetic flux among the devices 1301 and 1302. According to an embodiment, as illustrated in FIG. 13, the shield structure 1360 (in particular, the shield member 1340) may be disposed closer to the first device 1301 rather than the second device 1302.

According to various embodiments, the shield member 1340 may have a plate-like structure and may contact (be physically fixed) on one side of the circuit board 1330 through the connecting member 1350. According to an embodiment, the shield member 1340 may form at least one end of both ends (e.g., an upper or lower portion in a length (or height) direction in the drawing) in a bending structure. For example, the shield member 1340 may be at least partly bent.

According to an embodiment, a bending portion of the shield member 1340 may have a shape bent in a predetermined direction. According to an embodiment, a bending structure of the shield member 1340 may be designed in a shape "┐" or "└" by bending of an upper portion or a lower portion or may be designed in a shape "⊏" by bending of an upper portion or a lower portion. For example, the number of bending portions of the shield member 1340 may be plural. According to an embodiment, the shield member 1340 may not include a bending portion and may be formed in a plate-like structure (or a flat plate structure, or a shape "—"), as illustrated in FIG. 13.

According to an embodiment, an entire height (or length) and/or area of the shield member 1340 may be equal to or relatively larger than a size (e.g., height and/or area) of a magnetic substance to be shielded. Thereby, larger effects may be expected on magnetic field formation and magnetic force shielding with the magnetic substance to be shielded.

According to an embodiment, the shield member 1340 may be designed to have a variable thickness according to a magnetic force of the magnetic substance to be shielded. For example, a thickness of the shield member 1340 may be designed in a thickness to fully absorb magnetism of the magnetic substance to be shielded. According to an embodiment, the shield member 1340 may have a thickness of about 0.15 mm According to an embodiment, the shield member 1340 may contact (be connected to) the circuit board 1330 in an SMD method based on the connecting member 1350.

According to various embodiments, at one side (e.g., an upper side in the drawing) of the circuit board 1330, at least one electronic component may be provided, and the connecting member 1350 may contact the other side (e.g., a lower side in the drawing) of the circuit board 1330.

According to an embodiment, as at least part of the circuit board 1330 has a narrow width w between the first device 1301 and the second device 1302, the circuit board 1330 may include a portion (e.g., weak part) including relatively weak strength. In various embodiments, the connecting member 1350 of the shield structure 1360 may be used as a reinforcing member for reinforcing strength of the weak part of the circuit board 1330. For example, the connecting member 1350 may function as a member for reinforcing strength. According to an embodiment, the connecting member 1350 of the shield structure 1360 may enclose the weak part to correspond to the width w of the weak part. According to an embodiment, the connecting member 1350 may have a shape that encloses the circuit board 1330 (e.g., the weak part of the circuit board 1330) in a "concave" shape (or shape "⊏") structure. According to an embodiment, the connecting member 1350 may contact both sides (e.g., at least part of the left side, at least part of the right side) of the circuit board 1330 or at least one of a fixing groove of both sides or a lower surface of the circuit board 1330. According to an embodiment, the connecting member 1350 may have a shape of a bending structure of a shape "⌐" (or shape "⌐" in a viewing direction).

According to an embodiment, the connecting member 1350 may be a reinforcing member formed with a plurality of portions (e.g., a first portion, a second portion, and a third portion) divided according to a shape and/or function thereof. According to an embodiment, the connecting member 1350 may be divided into a first reinforcing member (e.g., a vertical member, a rod member) that is a first portion of a reinforcing member and for fixing to the first side (e.g., a groove of a left side surface or a left side surface of the weak part of the circuit board 1330 in a viewing direction of FIG. 13) of the circuit board 1330, a second reinforcing member 1352 that is a second portion of a reinforcing member and for fixing to the circuit board 1330 through the second side (e.g., a groove of a right side surface or a right side surface of the weak part of the circuit board 1330 in a viewing direction of FIG. 13) of the circuit board 1330, or a third reinforcing member 1353 (e.g., a bottom member) that is a third portion of the reinforcing member and contacting a lower surface of the circuit board 1330.

According to an embodiment, a first reinforcement member 1351 (e.g., a first portion of the reinforcement member) and the second reinforcement member 1352 (e.g., a second portion of the reinforcement member) may be fixed vertically to both sides of the third reinforcing member 1353 (e.g., a third portion of the reinforcing member). For example, the connecting member 1350 may be formed so that a first portion (first region) is disposed to correspond to the first surface (e.g., the left side in the drawing) of the circuit board 1330 and that the second portion (second region) is disposed to correspond to the second surface (e.g., the right side in the drawing) of the circuit board 1330 and that the third portion (third region) contacts a lower surface of the circuit board 1330. According to an embodiment, the connecting member 1350 may be formed so that the first reinforcing member 1351 (e.g., a first portion of the reinforcing member), the second reinforcing member 1352 (e.g., a second portion of the reinforcing member), or the third reinforcement member 1353 (e.g., a third portion of the reinforcement member) has a different function (or has different shapes).

According to an embodiment, in the connecting member 1350, one surface (e.g., inner surface) of the first reinforcing member 1351 of one end thereof may contact the first surface of the circuit board 1330 and at least one surface (e.g., a partial area of the inner surface side) of the second reinforcing member 1352 of the other end thereof may contact the second surface of the circuit board 1330. According to an embodiment, the shield member 1340 may contact the other surface (e.g., the outer surface) of the second reinforcing member 1352.

According to an embodiment, the first reinforcing member 1351 and the second reinforcing member 1352 may be formed in a structure including a size corresponding to each other or a width or a length (or height) of different sizes. According to an embodiment, the second reinforcing member 1352 may have a relatively smaller width and length than the first reinforcing member 1351, and the first reinforcing member 1351 may have a structure (e.g., a structure including a wide width and a long length) including a relatively larger width and length than that of the second reinforcing member 1352. For example, the first reinforcing member 1351 may contact the shield member 1340 in a larger area in consideration of bending prevention and contact force of the shield member 1340.

According to an embodiment, the second reinforcement member 1352 may have a height corresponding to (or equal to) a height (e.g., up to an upper surface of the circuit board 1330) of the circuit board 1330 (e.g., weak part). The first reinforcing member 1351 may protrude to a height higher than that of the circuit board 1330 (e.g., a structure protruded further than the upper surface of the circuit board 1330). According to an embodiment, the third reinforcing member 1353 may have a shape in which an entire upper surface (or inner surface) thereof contacts the circuit board 1330 (e.g., the weak part of the circuit board 1330).

According to an embodiment, the connecting member 1350 may have a shape that encloses a weak part of the circuit board 1330 in a concave shape (or shape "⌐") structure based on an integral shape of the first reinforcing member 1351, the second reinforcing member 1352, and the third reinforcing member 1353. According to an embodiment, the connecting member 1350 may have a shape of a bending structure of a shape "⌐" (or a shape "⌐" in a viewing direction) based on an integral shape of the first reinforcing member 1351 and the third reinforcing member 1353, except for the second reinforcing member 1352.

FIG. 14 illustrates the shield structure 1360 (in particular, the connecting member 1350) and part (e.g., weak part 1410) of the circuit board 1330 at a viewing point viewing the first device 1301 from the second device 1302 side of FIG. 13.

As illustrated in FIG. 14, in the connecting member 1350, the third reinforcing member 1353 is stacked on the circuit board 1330, and the second reinforcing member 1352 is bent and in which at least part of the third reinforcing member 1353 is extended to a length corresponding to a height H of the circuit board 1330.

According to an embodiment, the weak part 1410 of the circuit board 1330 may have a predetermined length (hereinafter, referred to as "length L"), and the third reinforcing member 1353 of the connecting member 1350 may be stacked in a shape including a length corresponding to the length L, a length shorter than the length L, or a length longer than the length L. FIG. 14 illustrates an example in which the third reinforcing member 1353 is formed longer than a length L in which the weak part 1410 is formed.

According to an embodiment, the second reinforcement member 1352 of the connecting member 1350 may be bent from the third reinforcing member 1353 to have a length corresponding to a length L of the weak part 1410 or a length smaller than the length L. FIG. 14 illustrates an example in which the second reinforcing member 1352 is formed in a length corresponding to a length L in which the weak part 1410 is formed. According to an embodiment, when a groove for fixing and mounting of the second reinforcement member 1352 is formed in the weak part 1410 of the circuit board 1330, the second reinforcement member 1352 may have a length corresponding to or smaller than a length (or width) of a groove of the weak part 1410.

Figure 15:
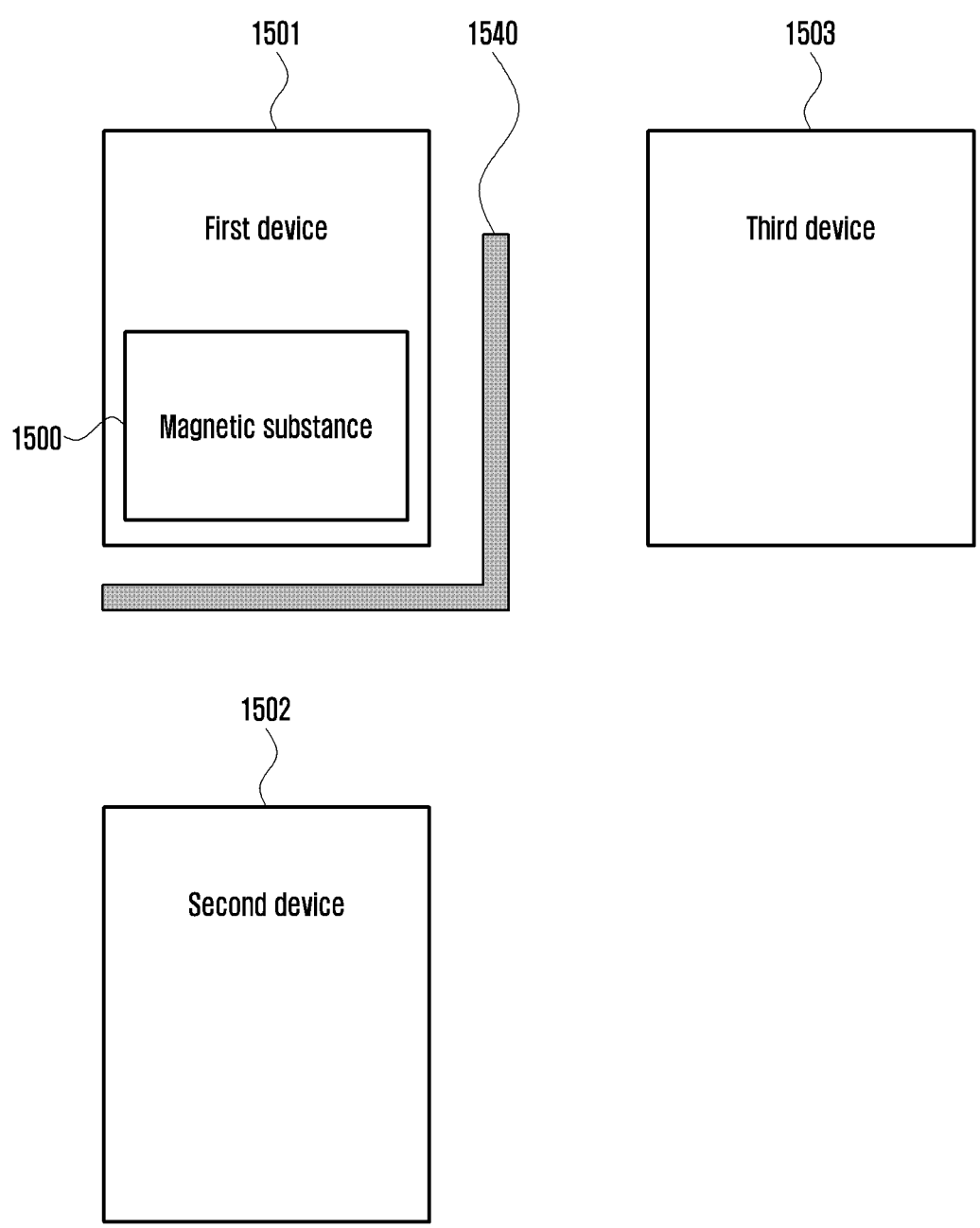
FIG. 15 is a diagram illustrating an example of a structure in which a shield structure shields a magnetic force between devices according to various embodiments of the disclosure.
Figure 16:
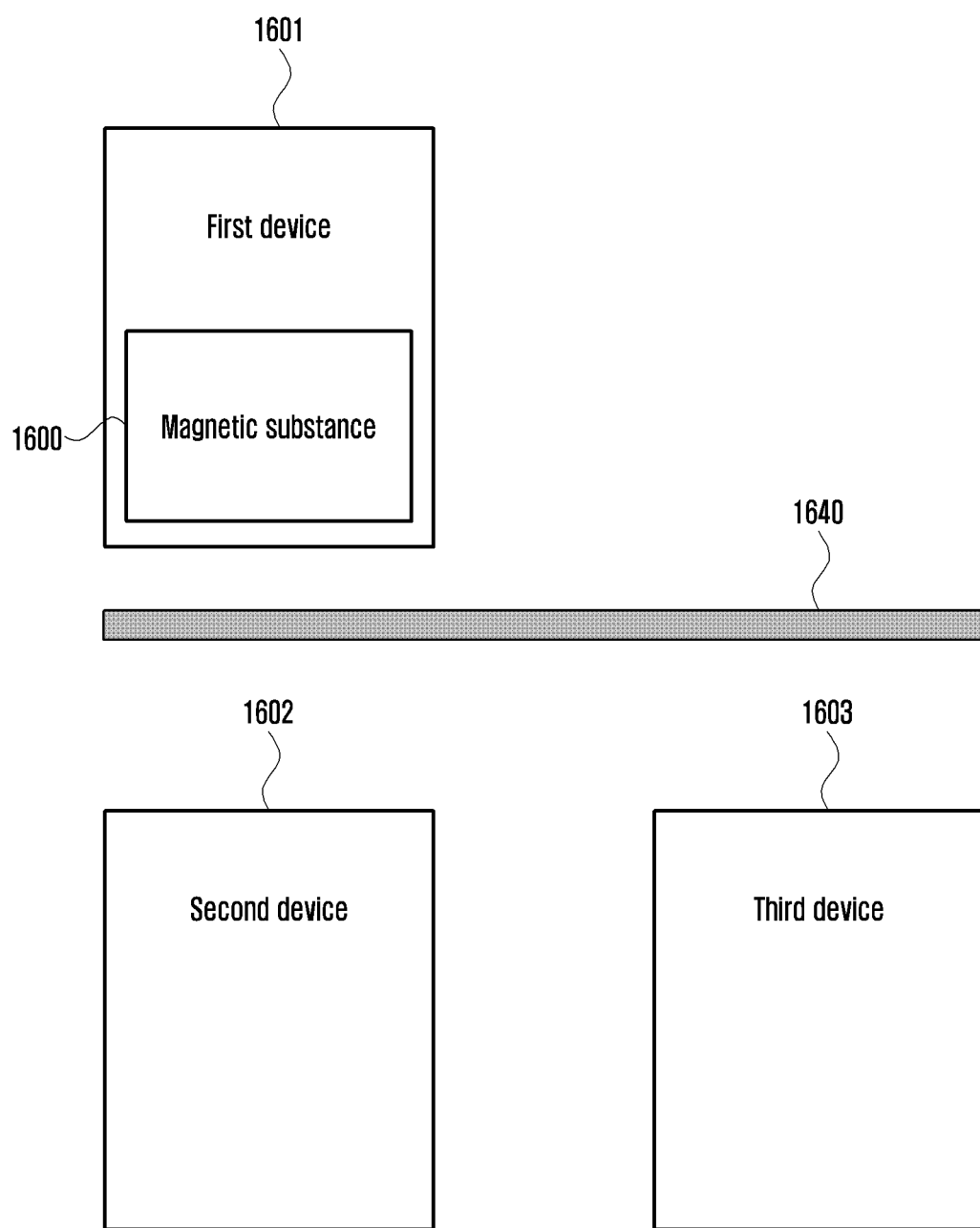
FIG. 16 is a diagram illustrating an example of a structure in which a shield structure shields a magnetic force between devices according to various embodiments of the disclosure.
Figure 17:
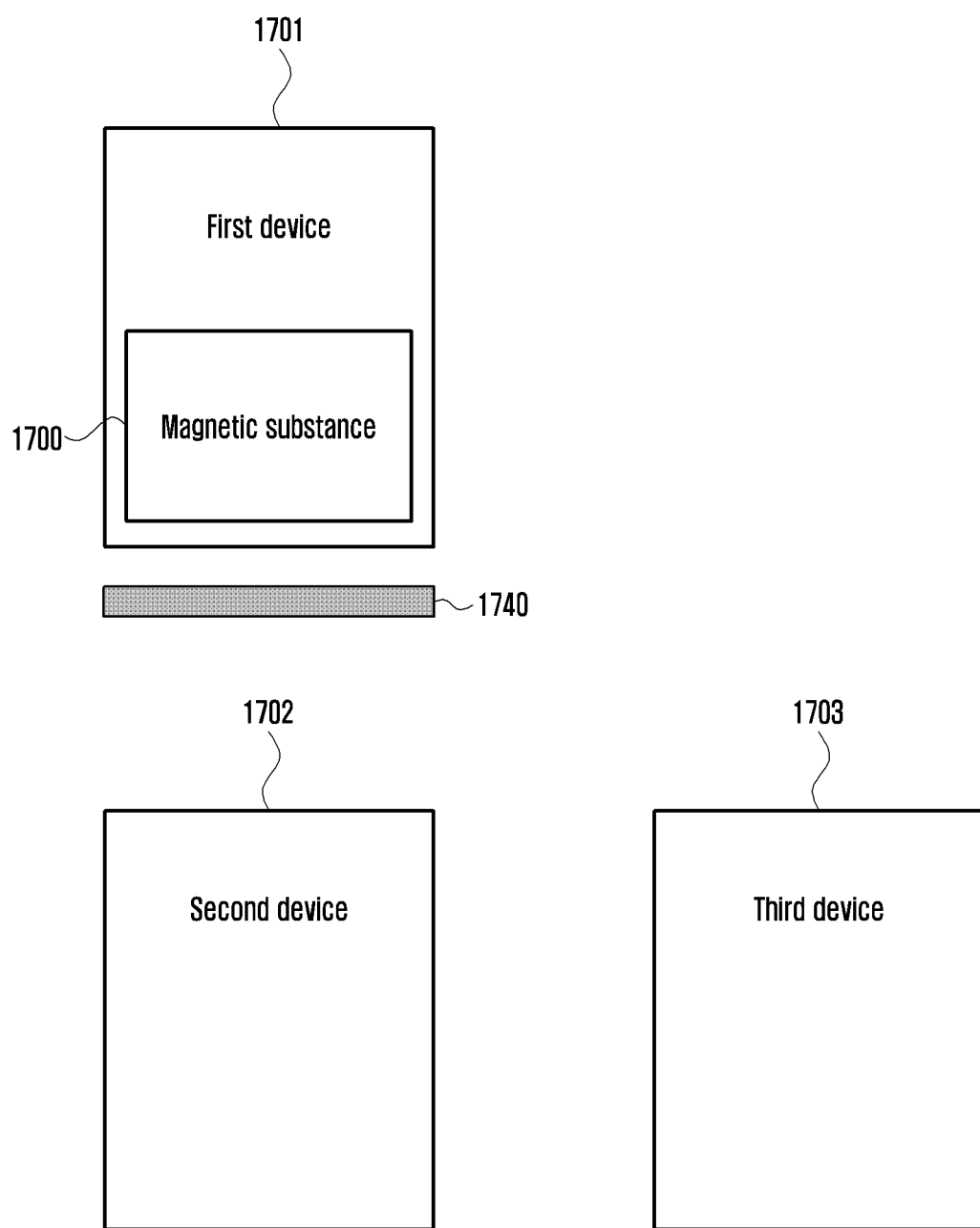
FIG. 17 is a diagram illustrating an example of a structure in which a shield structure shields a magnetic force between devices according to various embodiments of the disclosure.

FIGS. 15, 16, and 17 are diagrams illustrating a structure in which a shield structure shields a magnetic force between devices according to various embodiments of the disclosure.

Referring to FIG. 15, a first device 1501, second device 1502, and third device 1503 may be disposed at a circuit board (not illustrated), and the second device 1502 and the third device 1503 each may be disposed adjacent to the first device 1501 to be affected by a magnetic force generated by a magnetic substance 1500 of the first device 1501.

According to an embodiment, as illustrated in FIG. 15, the first device 1501 may be a speaker (or receiver) including a magnetic substance 1500, the second device 1502 may be a back-facing camera disposed adjacent under the first device 1501 and affected by a magnetic flux of the magnetic substance 1500, and the third device 1503 may be a front-facing camera disposed adjacent beside the first device 1501 and affected by a magnetic flux of the magnetic substance 1500. Although not illustrated in FIG. 15, a weak part of the circuit board may be formed between the first device 1501, the second device 1502, or the third device 1503, and a shield structure may be formed in the weak part. FIG. 15 schematically illustrates the shield member 1540 in the shield structure.

Referring to FIG. 15, in various embodiments, a shield member 1540 may have a shield structure not to affect the second device 1502 and the third device 1503 affected by the magnetic substance 1500 at a shield space (hereinafter, referred to as a "first shield space") between the first device 1501 and the second device 1502 and a shield space (hereinafter, referred to as a "second shield space") between the first device 1501 and the third device 1503. According to an embodiment, the shield member 1540 may have a structure bent about (or based on) the first device 1501 (or the magnetic substance 1500 of the first device 1501) in order to shield a magnetic force of the magnetic substance 1500 in the first shield space and the second shield space. For example, the shield member 1540 may be at least partly bent so as to shield each space between devices (e.g., first shield space, second shield space).

According to an embodiment, the shield member 1540 may have a bent shape in a predetermined direction. According to an embodiment, a bending structure of the shield member 1540 may be designed in a shape of "┐" or "└" or may be designed in a shape of "⊏" or "⊔". For example, the shield member 1540 may be formed in a structure that may be shielded in an entire shield space according to a position (e.g., disposition relationship) of a device to be shielded and the number of devices to be shielded. According to an embodiment, one shield member 1540 may shield a magnetic force of a plurality of devices in a periphery thereof through a bending structure of the shield member 1540. According to an embodiment, although not illustrated, the shield member 1540 may be fixed through a connecting member (not illustrated) formed in any one weak part of weak parts of the circuit board formed between the devices.

Referring to FIG. 16, a first device 1601, a second device 1602, and a third device 1603 may be disposed at a circuit board (not illustrated), and the second device 1602 may be disposed adjacent to the first device 1601, the third device 1603 may be disposed adjacent to the second device 1602, and the second device 1602 and the third device 1603 may be affected by a magnetic force generated by a magnetic substance 1600 of the first device 1601.

According to an embodiment, as illustrated in FIG. 16, the first device 1601 may be a speaker (or receiver) including a magnetic substance 1600, the second device 1602 may be a first back-facing camera disposed adjacent under the first device 1601 and affected by a magnetic flux of the magnetic substance 1600, and the third device 1603 may be a second back-facing camera disposed adjacent beside the second device 1602 but affected by a magnetic flux of the magnetic substance 1600. For example, FIG. 16 illustrates an example in which the magnetic substance 1600 has an influence on the third device 1603. Although not illustrated in FIG. 16, a weak part of a circuit board may be formed between the first device 1601, the second device 1602, or the third device 1603, and a shield structure may be formed in the weak part. FIG. 16 schematically illustrates a shield member 1640 in the shield structure.

Referring to FIG. 16, in various embodiments, the shield member 1640 may have a shield structure so that the second device 1602 and the third device 1603 are not affected by the magnetic substance 1600 in a shield space (hereinafter, referred to as a "first shield space") between the first device 1601 and the second device 1602 and a shield space (hereinafter, referred to as a "second shield space") between the first device 1601 and the third device 1603. According to an embodiment, the shield member 1640 may extend a length thereof to shield a magnetic force of the magnetic substance 1600 in the first shield space and the second shield space. For example, the shield member 1640 may be formed long by a length of the second device 1602 and the third device 1603 so as to shield both the second device 1602 and the third device 1603. According to an embodiment, the shield member 1640 may be formed in a flat plate structure (or shape "—") extended to a length to cover both the second device 1602 and the third device 1603. According to an embodiment, although not illustrated in FIG. 16, in a disposition structure of devices illustrated in FIG. 16, by forming the shield member 1640 in a bending structure as illustrated in FIG. 15, the shield member 1640 may include a structure for shielding the magnetic substance 1600 so that the magnetic substance 1600 does not affect the second device 1602 and the third device 1603.

Referring to FIG. 17, a first device 1701, a second device 1702, and a third device 1703 may be disposed at a circuit board (not illustrated), the second device 1702 may be disposed adjacent to the first device 1701, and the third device 1703 may be disposed adjacent to the second device 1702 and only the second device may be affected by a magnetic force generated by a magnetic substance 1700 of the first device 1701.

According to an embodiment, as illustrated in FIG. 17, the first device 1701 may be a speaker (or receiver) including a magnetic substance 1700, the second device 1702 may be a first back-facing camera positioned adjacent under the first device 1701 and affected by a magnetic flux of the magnetic substance 1700, and the third device 1703 may be a second back-facing camera positioned adjacent beside the second device 1702 but that is not affected by a magnetic flux of the magnetic substance 1700. For example, FIG. 17 illustrates an example in which an influence by the magnetic substance 1700 does not reach the third device 1703.

With reference to FIG. 17, in various embodiments, a shield member 1740 may include a structure for shielding so that the second device 1702 is not affected by the magnetic substance 1700 in a space (hereinafter, referred to as a shield space) between the first device 1701 and the second device 1702 affected by the magnetic substance 1700. According to an embodiment, the shield member 1740 may form a magnetic force of the magnetic substance 1700 in the shield space as much as a shieldable length. For example, the shield member 1740 may be formed by a length of the second device 1602 so as to shield only the second device 1602, in comparison with the shield member 1640 of FIG. 16. According to an embodiment, the shield member 1740 may be formed in a flat plate structure (or a shape " — ") capable of covering the second device 1702.

An electronic device according to various embodiments includes a first device 510 including a first magnetic substance 515, a second device 520 including a second magnetic substance 525, and a shield structure 560 for shielding at least part of a magnetic force generated between the first magnetic substance 515 and the second magnetic substance 525, wherein the shield structure 560 includes a shield member 540 disposed between the first device 510 and the second device 520 and including a property of a magnetic substance and a connecting member 550 physically connected to at least part of the shield member 540 and including a property of a nonmagnetic substance, wherein at least part of the connecting member 550 is physically connected to a circuit board 530.

According to various embodiments, the shield member 540 may be made of a magnetic material capable of shielding the at least a partial magnetic force.

According to various embodiments, the shield member 540 may be formed with SUS including a property of a ferromagnetic substance.

According to various embodiments, the connecting member 550 may be made of a nonmagnetic material that may be magnetically separated from the at least a partial magnetic force.

According to various embodiments, the nonmagnetic material may be made of a metal that is not affected by a magnetic field.

According to various embodiments, the metal may include nickel silver.

According to various embodiments, the shield member 540 and the connecting member 550 may contact each other with a SMD method.

According to various embodiments, at least one end of the shield member 540 may be formed in a bending structure.

According to various embodiments, in the circuit board 530, grooves (e.g., a first groove 630 and a second groove 640) for fixing the connecting member 550 may be formed.

According to various embodiments, the connecting member 550 may include first reinforcing members 610 and 710 including one surface contacting the first groove 630 of the circuit board 530, second reinforcing members 620 and 720 including one surface contacting the second groove 640 of the circuit board 530, and a third reinforcing member 730 including an upper surface contacting a lower surface 655 of the circuit board 530.

According to various embodiments, the other surfaces of the second reinforcing members 620 and 720 may contact one surface of the shield member 540.

According to various embodiments, the first reinforcing members 610 and 710 and the second reinforcing members 720 and 720 may be fixed vertically to both sides of the third reinforcing member 730.

According to various embodiments, the first reinforcing members 610 and 710 and the second reinforcing members 620 and 720 may have different widths and lengths.

According to various embodiments, the circuit board (e.g., a circuit board 1030 of FIG. 10) may include a weak part that may benefit from reinforcement between the first device and the second device, the shield structure (e.g., a shield structure 1060 of FIG. 10) may be disposed at the weak part, and the shield structure may reinforce the weak part with an elongated plate-like structure or a bending structure.

According to various embodiments, the connecting member (e.g., the connecting member 1050 in FIG. 10) may function as a member for reinforcing strength of the weak part.

According to various embodiments, the connecting member (e.g., the connecting member 1050 of FIG. 10) may have a length and width corresponding to a length and width of the weak part.

According to various embodiments, the shield member 540 may be disposed closer (or leaned) to any device (e.g., the first device 510) based on at least functional characteristics of the first device 510 and the second device 520.

According to various embodiments, the functional characteristics may include characteristics according to whether a driving method of the device is affected by the magnetic force.

According to various embodiments, the shield member 540 may be larger than or equal to a size of the magnetic substance (e.g., the first magnetic substance 515) to be shielded.

According to various embodiments, at a distance (e.g., a length A) between the first device 510 and the second device 520, a distance (e.g., a length B) between the shield member 540 and the other magnetic object (e.g., the first magnetic substance 515) not to be shielded may be a maximum separation distance.

An electronic device according to various embodiments includes a circuit board 530, a first device 510 including a first magnetic substance 515, a second device 520 including a second magnetic substance 525, and a shield structure 560 for shielding at least part of a magnetic force generated between the first magnetic substance 515 and the second magnetic substance 525, wherein the shield structure 560 includes a shield member 540 disposed between the first device 510 and the second device 520 and including the property of a magnetic substance capable of shielding at least a partial magnetic force, and a connecting member 550 physically connected to at least part of the shield member 540 and fixed to the circuit board 530, and the connecting member 550 has a property of a nonmagnetic substance that may be magnetically separated from the at least a partial magnetic force.

According to various embodiments, at least part of the connecting member 550 may be physically connected to the circuit board 530 and at least another portion may be physically connected to the shield member 540.

According to various embodiments, the shield member 540 may be disposed closer (or leaned) to any device (e.g., the first device 510) based on at least functional characteristics of the first device 510 and the second device 520, but a distance (e.g., length B) between the shield member 540 and another magnetic substance (e.g., the second magnetic substance 525) not to be shielded may be disposed to have a maximum separation distance and may be equal to or larger than a size of the magnetic substance to be shielded.

An electronic device according to various embodiments includes a device (e.g., a first device 510) including a magnetic substance, a circuit board 530, and a shield structure 560 for shielding at least part of the magnetic field generated by the magnetic substance, wherein the shield structure 560 includes a shield member 540 disposed between the device (e.g., a first device) and another device (e.g., a second device not including a magnetic substance) included in the electronic device and including a property of a ferromagnetic substance capable of shielding at least a partial magnetic field and a connection member 550 physically connected between at least part of the shield member 540 and the circuit board 530, wherein the connecting member 550 has a property of a nonmagnetic substance that may be magnetically separated from the at least a partial magnetic field.

According to various embodiments, the shield member 540 and the connecting member 550 may be connected with a SMD method.

According to various embodiments, the shield member 540 may be at least partly bent.

According to various embodiments, in the connecting member 550, the first members 610 and 710 may be disposed to correspond to the first groove 630 of the circuit board 530, the second members 620 and 720 may be disposed to correspond to the second groove 640 of the circuit board 530, and the third regions 630 and 730 may contact the lower surface 655 of the circuit board 530, and the first region 710 and the second region may be fixed vertically to both sides of the third region, and the second region may contact at least part of the shield member 540.

According to various embodiments, by disposing (e.g., forming with a SMD method) a nonmagnetic material (e.g., nickel silver) and a magnetic shield material, which is a magnetic material on a circuit board formed between the electronic components of the electronic device, a shield structure (shield member) may be formed. Thereby, according to various embodiments, a contact structure may be implemented without limit while minimizing a distance between the electronic components.

According to various embodiments, it is possible to increase the degree of freedom with respect to a mounting position between electronic components including a magnetic substance through a shield structure (shield member) made of heterogeneous materials capable of shielding a magnetic force between two adjacent magnetic substances, and by maximizing a shield performance between magnetic substances, an operation (function) error by an influence (interference) of a magnetic force between the electronic components can be prevented.

According to various embodiments, in an electronic device, even if electronic components each including a magnetic substance are disposed adjacent to each other, it is possible to operate without an error while shielding an influence of the magnetic force on the other electronic component. According to various embodiments, by simplifying a configuration of the shield structure, the shield structure can be easily produced and be easily installed without detaching from the fixing member (e.g., circuit board).

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. A mobile electronic device, comprising:
    a circuit board;
    a first device comprising a first magnetic part;
    a second device comprising a second magnetic part;
    a first metal part configured to shield a magnetic force generated by the first magnetic part from the second device; and
    a second metal part configured to support the circuit board,
    wherein the first metal part is disposed between the first device and the second device in a vertical standing orientation with respect to the circuit board,
    wherein the first metal part and the second metal part are attached to each other, and
    wherein the first metal part is formed of a metal material different from a metal material forming the second metal part.

2. The mobile electronic device of claim 1, wherein the first metal part has plate-like structure capable of shielding the magnetic force generated between the first device and the second device.

3. The mobile electronic device of claim 1, wherein the first metal part is disposed closer to any one device between the first device and the second device.

4. The mobile electronic device of claim 1, wherein the first metal part and the second metal part are each made of a metal that is not affected by the magnetic force generated by the first magnetic part from the second device.

5. The mobile electronic device of claim 1, wherein the first metal part is made of a first element or the first element based alloy.

6. The mobile electronic device of claim 5, wherein the first element includes cobalt (Co).

7. The mobile electronic device of claim 1, wherein the second metal part is made of a second element or the second element based alloy.

8. The mobile electronic device of claim 7, wherein the second element includes at least one of iron (Fe), nickel (Ni) or copper (Cu).

9. The mobile electronic device of claim 1, wherein the first metal part and the second metal part contact each other with a surface mount device (SMD) method.

10. The mobile electronic device of claim 1, wherein the first metal part is bent at least partially.

11. The mobile electronic device of claim 1, wherein the circuit board has a groove configured to fix the first metal part.

12. The mobile electronic device of claim 1, wherein at least part of the first metal part is physically connected to the circuit board through the second metal part.

13. The mobile electronic device of claim 12, wherein the second metal part is adhered to one surface of the circuit board.

14. The mobile electronic device of claim 12, wherein the first metal part and the second metal part are formed vertically.

15. The mobile electronic device of claim 1, wherein the first metal part and the second metal part have different widths and lengths.

16. The mobile electronic device of claim 1, wherein the first metal part and the second metal part each include a property of a nonmagnetic part for the shield.

17. The mobile electronic device of claim 16, wherein at least part of the first metal part is directly connected to at least part of the second metal part on a side.

18. The mobile electronic device of claim 1, wherein the first metal part is disposed closer to one device side based on at least functional characteristics of the first device and the second device.

19. A mobile electronic device, comprising:
a circuit board;
a first component comprising a first magnetic part;
a second component comprising a second magnetic part;
a first metal part disposed in a vertical standing orientation with respect to the circuit board so as to absorb a magnetic flux generated by the first magnetic part; and
a second metal part configured to support the circuit board,
wherein the first metal part and the second metal part are attached to each other, and
wherein the first metal part is formed of a metal material having a magnetic flux absorption property that is greater than a magnetic flux absorption property of a metal material forming the second metal part.

20. The mobile electronic device of claim 19, wherein the second component corresponds to a camera component and the first metal part is formed of cobalt (Co) so as to magnetically shield an auto focus mechanism of the camera component from a magnetic flux of the first magnetic part.

21. The mobile electronic device of claim 19, wherein the second component corresponds to a camera component and the first metal part is made of an alloy including cobalt (Co) so as to shield an auto focus mechanism of the camera component from a magnetic flux of the first magnetic part.

* * * * *